(12) United States Patent
Gardner et al.

(10) Patent No.: US 11,515,306 B2
(45) Date of Patent: Nov. 29, 2022

(54) UNIFIED ARCHITECTURAL DESIGN FOR ENHANCED 3D CIRCUIT OPTIONS

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 34 days.

(21) Appl. No.: 17/109,860

(22) Filed: Dec. 2, 2020

(65) Prior Publication Data

US 2021/0313327 A1 Oct. 7, 2021

Related U.S. Application Data

(60) Provisional application No. 63/006,324, filed on Apr. 7, 2020.

(51) Int. Cl.
| | |
|---|---|
| *H01L 27/092* | (2006.01) |
| *H01L 29/06* | (2006.01) |
| *H01L 29/423* | (2006.01) |
| *H01L 29/786* | (2006.01) |
| *H01L 21/02* | (2006.01) |
| *H01L 21/8238* | (2006.01) |
| *H01L 29/66* | (2006.01) |

(52) U.S. Cl.
CPC .... *H01L 27/0922* (2013.01); *H01L 21/02532* (2013.01); *H01L 21/02603* (2013.01); *H01L 21/823807* (2013.01); *H01L 29/0673* (2013.01); *H01L 29/42392* (2013.01); *H01L 29/66742* (2013.01); *H01L 29/78696* (2013.01)

(58) Field of Classification Search
CPC .......... H01L 27/0922; H01L 21/02532; H01L 21/02603; H01L 21/823807; H01L 29/0673; H01L 29/42392; H01L 29/66742; H01L 29/78696; H01L 21/823412; H01L 21/823456; H01L 21/82385; H01L 27/092; H01L 27/088; H01L 29/66439; H01L 29/6656
USPC ....................................................... 257/351
See application file for complete search history.

(56) References Cited

U.S. PATENT DOCUMENTS

2019/0280107 A1* 9/2019 Ando ................ H01L 29/66439

* cited by examiner

*Primary Examiner* — Tong-Ho Kim
(74) *Attorney, Agent, or Firm* — Oblon, McClelland, Maier & Neustadt, L.L.P.

(57) ABSTRACT

A method of forming a semiconductor device is presented. A layer stack of alternating epitaxial materials including one or more layers is formed. The layer stack of alternating epitaxial materials into a first region of nano sheets and a second region of nano sheets is divided. A first field effect transistor on a working surface of a substrate using the nano sheets in the first region of nano sheets is formed. A stack of field effect transistors on the working surface of the substrate using the nano sheets in the second region of nano sheets is formed.

20 Claims, 20 Drawing Sheets

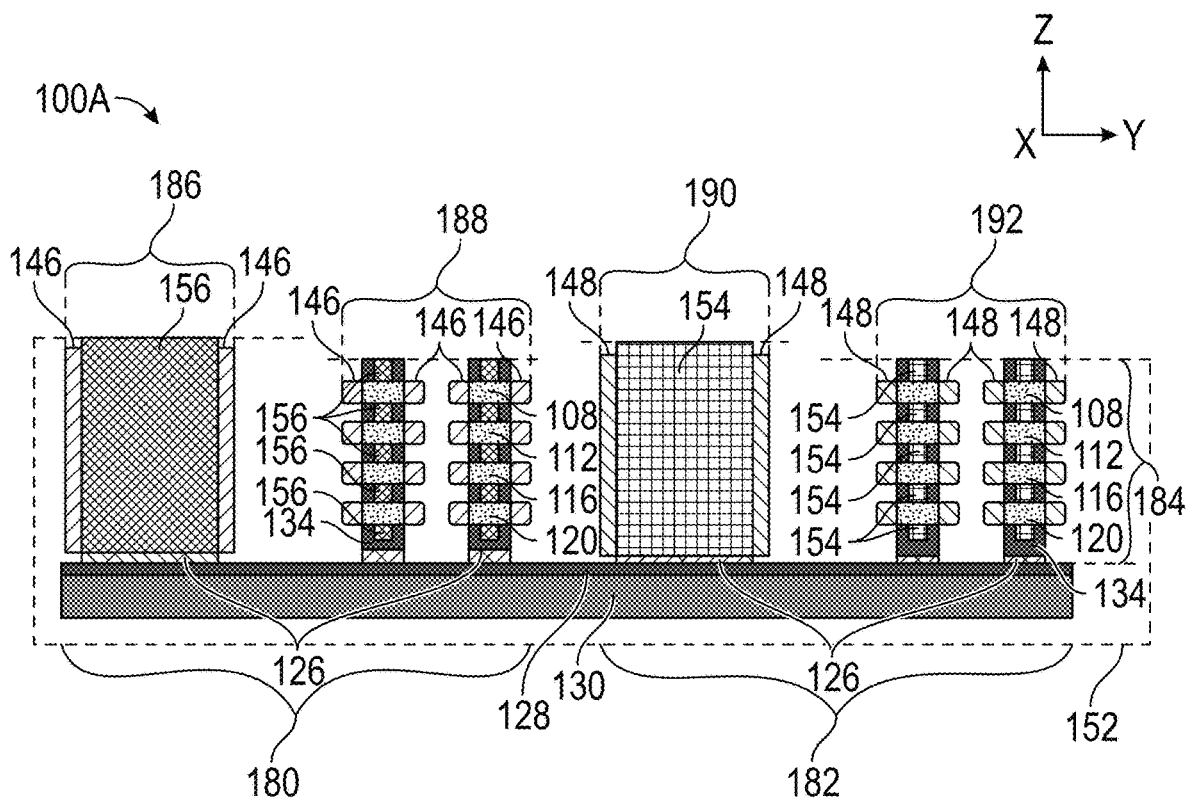

FIG. 1A

S101 — Form a layer stack of alternating epitaxial materials including one or more layers

S102 — Divide the layer stack into a first region of nano sheets and a second region of nano sheets

S103 — Form a first field effect transistor on a working surface of a substrate using the nano sheets in the first region

S104 — Form a stack of field effect transistors on the working surface of the substrate using the nano sheets in the second region

FIG. 1B

UNIFIED ARCHITECTURAL DESIGN FOR ENHANCED 3D CIRCUIT OPTIONS

INCORPORATION BY REFERENCE

This present disclosure claims the benefit of U.S. Provisional Application No. 63/006,324, filed on Apr. 7, 2020, the entire content of which is incorporated herein by reference in its entirety.

FIELD OF THE INVENTION

This disclosure relates to integrated circuits and the fabrication of semiconductor devices.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and methods of forming the semiconductor device.

A first aspect is a semiconductor device. The semiconductor device can include a first field effect transistor disposed adjacent to a stack of field effect transistors on a working surface of a substrate. The first field effect transistor can have a channel structure formed from a first plurality of nano sheets. The first plurality of nano sheets can extend parallel to the working surface and arranged one over another in a first vertical perpendicular to the working surface of the substrate. The first plurality of nano sheets has a common gate metal.

The semiconductor device can include the stack of field effect transistors. The stack of field effect transistors can include one or more transistors arranged in a second vertical stack. The one or more transistors have a second plurality of nano sheets on the second vertical stack. Each of the second plurality of nano sheets on the second vertical stack has a gate-all-around metal. The second vertical stack is adjacent to the first vertical stack.

In some embodiments, nano channels in the first field effect transistor and the stack of field effect transistors can be formed from a common epitaxial stack. The common epitaxial stack can include at least one of Si, SiGe, and SiGe2.

In some embodiments, the first field effect transistor can have a first threshold voltage and each transistor in the stack of field effect transistors can have a second threshold voltage. The first threshold voltage can be greater than the second threshold voltage.

In some embodiments, nano sheets in the first field effect transistor can have a greater length than nano sheets in the stack of field effect transistors. The first field effect transistor can have a source/drain structure connected to one or more individual nano sheets.

A second aspect is a method of forming a semiconductor device. A layer stack of alternating epitaxial materials can be formed. The layer stack of alternating epitaxial materials can includes one or more layers. The layer stack of alternating epitaxial materials can be divided into a first region of nano sheets and a second region of nano sheets, the first region of nano sheets having a common gate metal and the second region of nano sheets having a gate-all-around metal. A first field effect transistor can be formed on a working surface of a substrate. The formation can use the nano sheets in the first region. A stack of field effect transistors can be formed on the working surface of the substrate. The formation can use the nano sheets in the second region.

In some embodiments, the epitaxial materials can include at least one of Si, SiGe, and SiGe2. The substrate can include at least one of silicon/oxide/silicon substrate, and silicon substrate. The one or more layer can be for channels of field effect transistors.

In some embodiments, the first region of nano sheets can be for transistor with a first threshold voltage and the second region of nano sheets can be for transistors with a second threshold voltage. The first threshold voltage can be greater than the second threshold voltage.

In some embodiments, the transistors with the second threshold voltage can be in a vertical stack. The first field effect transistor can have the first threshold voltage, and each transistor in the vertical stack can have the second threshold voltage. The first threshold voltage can be greater than the second threshold voltage.

In some embodiments, the first field effect transistor can have a channel structure formed from one or more nano sheets in the first region.

In some embodiments, the one or more nano sheets in the first region can extend parallel to the working surface of the substrate and disposed one over another in a vertical stack. The vertical stack can be perpendicular to the working surface of the substrate.

In some embodiments, the stack of field effect transistors can include one or more transistors arranged in a vertical stack. Each transistor in the vertical stack can include a nano sheet channel having a gate-all-around structure. The first field effect transistor can have a source/drain structure connected to one or more individual nano sheets.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 1A shows a cross-sectional view of a semiconductor device, in accordance with some embodiments;

FIG. 1B shows a flow chart of an exemplary process for manufacturing an exemplary semiconductor device, in accordance with embodiments of the disclosure;

DETAILED DESCRIPTION

Figure 2:
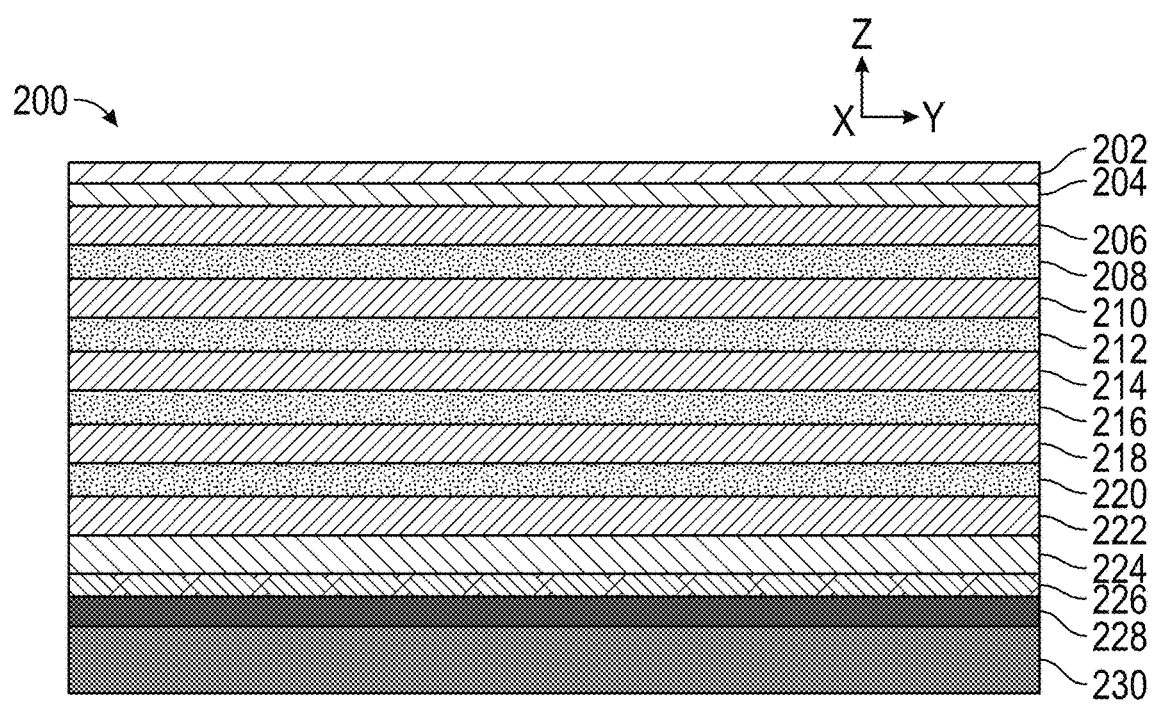
FIGS. 2-29 are cross-sectional views of a semiconductor device at various intermediate steps of a first manufacturing process, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

Techniques herein include semiconductor devices and methods of making that enable high voltage (HV) devices to be formed side-by-side with low voltage (LV) devices. Both high voltage devices and low voltage devices are formed using nano sheets from a same epitaxial layer stack. High voltage devices use a block of nano sheets tied together for a higher threshold voltage, while lower voltage devices are formed as a stack of lateral gate-all-around field effect transistors, which provides high performance. Various embodiments support forming the high voltage block nano sheet stack and the gate-all-around low voltage 3D stack on different substrates or layers. For example silicon-on-insulator, directly on silicon, and with or without a silicon-germanium base. In one example embodiment, a block nano sheet is integrated with nano sheet GAA (gate-all-around) using a substrate with silicon on oxide on silicon, which can be seen in FIG. 1B. This example flow keeps a base SiGe2 layer intact for the block nano sheet but removes the base SiGe2 layer for GAA devices. One advantage is that this flow enables any size W (transistor width) or L (transistor length) for the block Nano sheet. The GAA nano sheet allows for L and W to be restricted to less than 150 nm and is co-integrated with the block nano sheet.

Accordingly, techniques herein enable unified architecture (both high voltage and low voltage devices formed adjacent to each other) with many circuit design options. These techniques enable higher density circuits to be produced at reduced cost. Using an optimum substrate for a given design the block nano sheet has no restrictions for either W (width) or L (length) of the transistor. This is beneficial because many circuits (for example NAND and DRAM) have high voltage devices with long channel lengths. This key feature enables co-integration of HV (high voltage) devices and LV (low voltage) devices on any circuit for maximum 3D logic and memory integration. Block nano sheets herein can be formed without a channel release step so the current flow of the transistor uses the entire block. Nano sheet stacks herein can provide robust drive currents using three planes of the surface area without separating the nano sheets. And the block nano sheet transistor herein is compatible with emerging 3D nano sheet flows. Integration of the block nano sheet with GAA nano sheet provides a unified architectural design for complete circuit integration of 3D logic with necessary high performance CMOS elements to enable HV and LV devices without limitation.

In another example embodiment, a silicon substrate wafer is used. The embodiment keeps the base SiGe2 layer intact for only the block nano sheet, which can be seen in FIG. 39. The GAA nano sheet device has the SiGe2 layer removed and then replaced with dielectric materials. The process flow requires making a well substrate doping background in the NMOS (P-type well) and PMOS (n-type well). The embodiment uses a well tap connection that is achieved with the buried power rail in substrate option as one example. Another example is the well tap connection can be achieved from metal connection between transistors at M0 or M1 layers. The process flow allows any size W (transistor width) or L (transistor length) for the block nano sheet. The GAA nano sheet device allows the L and W to be restricted to less than 150 nm and is co-integrated with the block nano sheet device. Nano sheets with a GAA typically have a maximum L because the channel region is suspended.

Accordingly, methods and devices herein include block nano sheet devices adjacent to, or on the same substrate/chip as GAA nano sheet devices. Block nano sheet devices can have one large channel comprised of multiple nano sheets. Thus, block nano sheet devices can have 2, 4, 7, 12, or more nano channels. In most embodiments, a disposable layer (SiGe) layer between nano sheets is not removed and this enables more surface area and simplification of process flow. Block nano sheet devices can use W or L values without limitation for some process flows, can be used for high voltage (HV) or low voltage (LV) devices, and can have thicker gate oxide values required for HV devices.

Compared to block nano sheet devices, GAA nano sheet devices have two or more discrete channels stacked vertically. The disposable SiGe layer between silicon channels is removed. GAA nano sheet devices are typically limited to a W of 150 nm or less. GAA nano sheet devices are used for LV devices. They also typically have a maximum channel length L because the channel is cantilevered by the inner spacer. And GAA nano sheet devices have a relative limitation on how thick a gate oxide and metal work function stack can be.

In one embodiment, a block nano sheet device is integrated with GAA nano sheet device using a substrate with silicon/oxide/silicon. This embodiment keeps a base SiGe2 layer intact for only the block nano sheet. One benefit of this embodiment enabling any size W (transistor width) or L (transistor length) for the block nano sheet. The GAA nano sheet allows for L and W to be restricted to less than 150 nm and is co-integrated with the block nano sheet. Note that in any of these embodiments there are options for integration with a buried power rail (power rail positioned below active devices). A buried power rail can be included in the substrate only, on top of transistors in a dielectric film, or the power rail is positioned in metal layers above active devices.

In a first step, a layer stack is formed of epitaxial material on a substrate. This layer stack can have multiple layers to be formed as field effect transistor channels, such as silicon layers. Another epitaxial material (epitaxial SiGe) can alternate with the silicon layers. Yet another epitaxial material (epitaxial SiGe2) can be with the silicon layers and epi SiGe layers. Note that there are many different epitaxial layers form using different elements as well as dopants and element ratios. Given nano sheet stacks can, for example, also be SiGe2/Si/Ge/Si/Ge for Ge channels. So any stack is possible with embodiments herein. Additionally different types of stacks need to be claimed on the same wafer surface as options. With such differences, a given one of the materials can be etched without etching the other layers using a vapor phase etch.

FIG. 1A shows a cross-sectional view of a semiconductor device 100A, in accordance with some embodiments. The device 100A includes a substrate 130 and a semiconductor layer 184 over the substrate 130. The semiconductor layer 184 can be made of Si, Ge, SiGe, SiGe2, or another semiconductor material with n-type or p-type doping, depending on design requirements. In this example, the device 100A can also include an insulating material 128 sandwiched between the semiconductor layer 184 and the substrate 130.

The device 100A further includes at least two regions of transistors (e.g., a first region of transistors 180 and a second region of transistors 182). Each region of transistors (e.g., a first region of transistors 180) includes a plurality of transistors (e.g., a first transistor 186 and a second transistor 188) that are separated from each other along an XZ plane. Another region of transistors (e.g., the second region of transistors 182) includes a plurality of transistors (e.g., a first transistor 190 and a second transistor 192) that are separated from each other along an XY plane. While only transistors 186, 188, 190, and 192 are shown in this example, it is understood that each region can include more than two transistors in other embodiments. As a result, the device 100A can typically include more than two transistors in more than two regions.

The device, e.g., the first transistor 186, can be a block NMOS nano sheet region for a high voltage device. The device, e.g., the second transistor 188, can be a GAA NMOS nano sheet region for a low voltage device. The device, e.g., the first transistor 190, can be a block PMOS nano sheet region for a high voltage device. The device, e.g., the second transistor 192, can be a GAA PMOS nano sheet region for a low voltage device.

Still referring to FIG. 1A, transistors in the first region of transistors 180 can include a first metal stack 156 in the block NMOS nano sheet region, e.g., the first transistor 186, for a high voltage device, and the first metal stack 156 is also in the GAA NMOS nano sheet region, e.g., the second transistor 188, for a low voltage device. The transistors are disposed on a silicon 126/oxide 128/silicon 130 substrate. Transistors in the second region of transistors 182 can include a second metal stack 154 in the block NMOS nano sheet region, e.g., the first transistor 190, for a high voltage device, and the second metal stack 154 is also in the GAA NMOS nano sheet region, e.g., the second transistor 192, for a low voltage device.

The first metal stack 156 in the device 186 is sandwiched between two N+ Epi layers 146 which can be source/drain regions. The first metal stack 156 in the device 188 is sandwiched in oxide layers 134. The Epi silicon stack 108, 112, 116, and 120 in the device, e.g., the second transistor 188, is sandwiched in N+ Epi layers 146. The second metal stack 154 in the device, e.g., the first transistor 190, is sandwiched between two P+ Epi layers 148 which can be source/drain regions. The second metal stack 154 in the device, e.g., the second transistor 192, is sandwiched in oxide layers 134. The Epi silicon stack 108, 112, 116, and 120 in the device, e.g., the second transistor 192, is sandwiched in P+ Epi layers 148. The area within the dashed line 152 is filled with oxide during the chemical mechanical polishing (CMP) process.

FIG. 1B shows a flow chart of an exemplary process 100B for manufacturing an exemplary semiconductor device, such as the device 100A and the like, in accordance with embodiments of the disclosure. The process 100B begins with step S101 where an initial stack of layers is formed over a semiconductor layer. The initial stack of layers can include a plurality of epitaxial materials that are adjacent to each other. The epitaxial materials can be at least one of SiGe epitaxial material, silicon epitaxial material, and SiGe2 epitaxial material.

At step S102, the layer stack is divided into two nano sheets regions.

At step S103, a first field effect transistor on a working surface of a substrate using the nano sheets in the first region is formed.

At step S104, a stack of field effect transistors on the working surface of the substrate using the nano sheets in the second region is formed.

It should be noted that additional steps can be provided before, during, and after the process 100B, and some of the steps described can be replaced, eliminated, or performed in a different order for additional embodiments of the process 100B.

Referring to FIG. 2, the manufacturing process flow can begin by creating a stack of layers. The cross-sectional substrate segment, e.g., device 200, shows a substrate includes a layer of an oxide layer 228 formed between two silicon layers 226 and 230 (silicon/oxide/silicon). Then a base SiGe2 layer 224 of epitaxial SiGe2 layer is formed on the substrate. As described earlier, a block nano sheet is integrated with nano sheet GAA (gate-all-around) using the substrate with silicon 226 on oxide layer 228 on silicon 230. This flow keeps the base SiGe2 layer 224 intact for the block nano sheet but removes the base SiGe2 layer 224 for GAA devices. One advantage is that this flow enables any size W (transistor width) or L (transistor length) for the block Nano sheet. The GAA nano sheet allows for L and W to be restricted to less than 150 nm and is co-integrated with the block nano sheet.

Then over the base layer of the base SiGe2 layer 224, a stack of layers is formed. The stack of layers can include a plurality of layers which include five epitaxial SiGe layers 206, 210, 214, 218, 222 and four epitaxial Si layers 208, 212, 216, 220 alternatively disposing with each other. Note that in other embodiments, the device 200 can include more or less than five epitaxial SiGe layer and four epitaxial Si layers. In addition, a hard mask including an oxide layer 204 and a nitride layer 202 is formed over the stack of layers in this example.

The stack of layers can be, but not limited to, nano sheet stack. The nano sheet stack can also include, but not limited to, epitaxial silicon layer disposing on the base epitaxial SiGe2 layer, and then epitaxial Ge and epitaxial Si alternatively disposing on the epitaxial silicon layer for Ge channels.

This example embodiment uses N+ epitaxial material grown for the source, drain, and channel for NMOS, and P+ epitaxial material grown for the source, drain, channel for PMOS as an example. Any channel or S/D regions, however, are possible. Techniques herein generally provide a method of making 3D semiconductor device.

Figure 3:
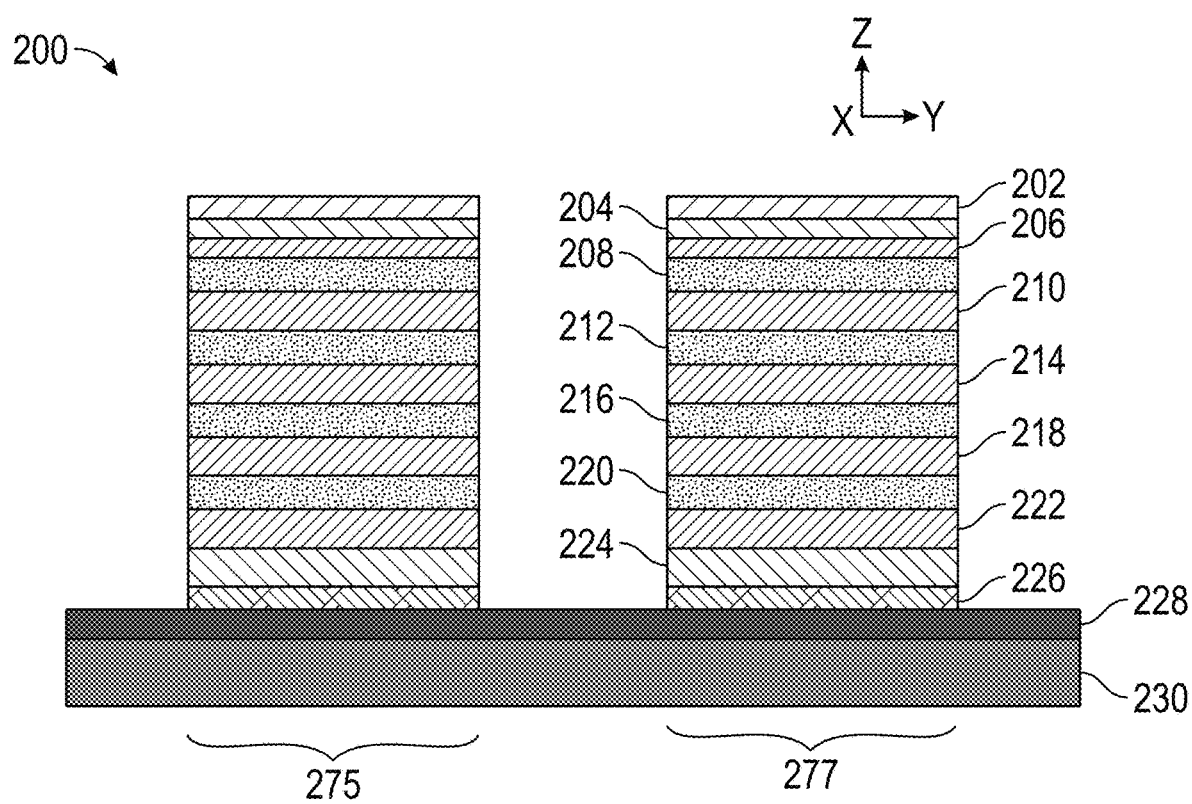

In FIG. 3, nano sheet stacks (e.g., first nano sheet stack 275 and second nano sheet stack 277) are formed from the stack of layers using the hard mask layer including 202 and 204. The nano sheet stacks, e.g., the first nano sheet stack 275 and the second nano sheet stack 277, in this example can form one or more SiGe channels.

The hard mask can be used in the process in FIG. 3 to divide the stack of layer into the nano sheet stacks, e.g., the first nano sheet stack 275 and the second nano sheet stack 277. The hard mask layer including the oxide layer 204 and the nitride layer 202 is made of different materials that are chosen to all be selective. That is, there are one or more etchants and/or etching conditions such that a given material can be etched without etching (or substantially etching) the other two materials. An example dielectric scheme can include oxide based SiOx, SiOxNy based, high-k based, and High-k OxNy based. With high-k materials, changing an element used with high-k or with oxide can cause selectivity also within the different types of high-k. Either wet etch or dry etch can be used. To further enhance selectivity options, combinations of all wet etch, all dry etch, or wet and dry etch can also provide more options for a three-material selectivity scheme.

Specifically, a first etch mask (not shown) is formed over the stack of layer. This can be a photoresist mask. An etching process is then executed using this first mask to create the openings down to the layer of semiconductor material 205. Note that the openings formed in the stack can be rectangular, cylindrical, or other shapes. Subsequently, the first etch mask is removed, followed by etching the openings through the stack of layers.

The width of the first nano sheet stack 275 and the second nano sheet stack 277 can be any size. The width of the first nano sheet stack 275 can be used for block nano sheet region, which can be longer than or shorter than the width of the second nano sheet stack 277. A buried power rail (not shown) can optionally be formed between the stacks.

Figure 4:
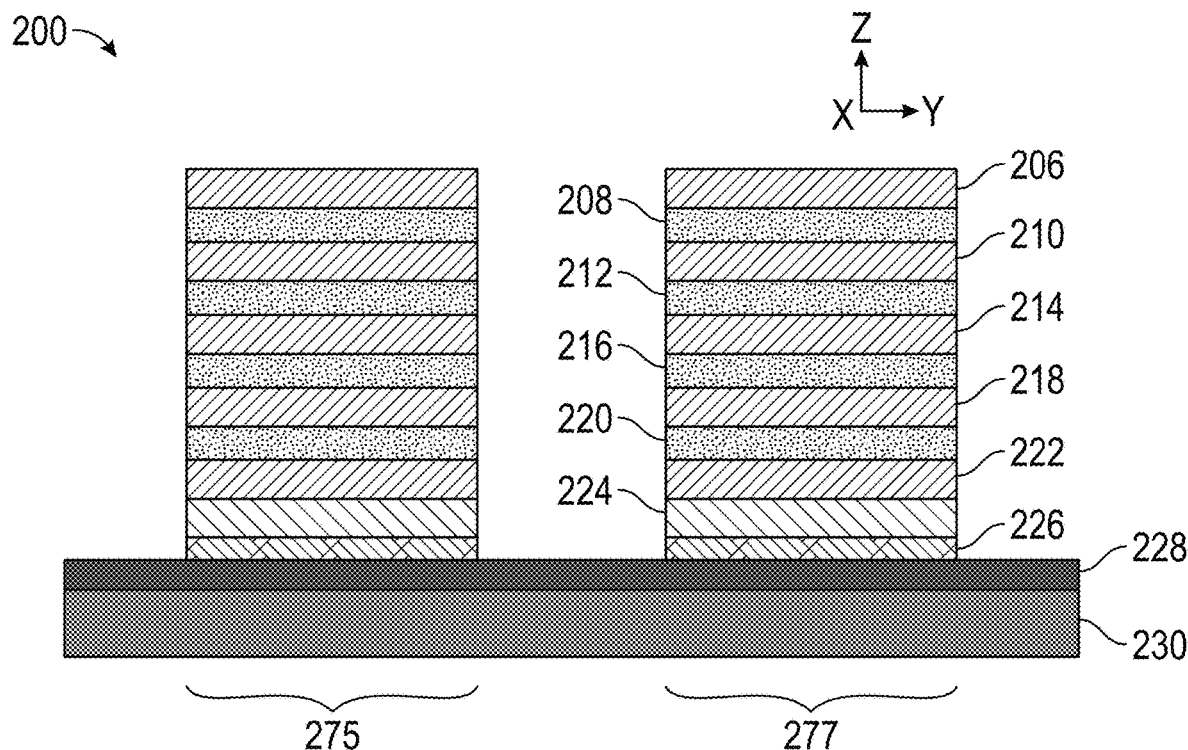

In FIG. 4, the hard mask layer including the oxide layer 204 and the nitride layer 202 is removed. The removal of the oxide layer 204 and the nitride layer 202 can be performed by wet etching process or dry etching process. The wet etching process can include, but not limited to, one or more etchants or solutions which can etch nitride and oxide layers. The dry etching process can be performed by, but not limited to, a plasma etching machine. The plasma etching can include one or more chemicals in gaseous state under a high voltage to etch the oxide and nitride layers. The dose can range, but not limited to, from 5E12 to 5E16 ions/cm2.

Figure 5:
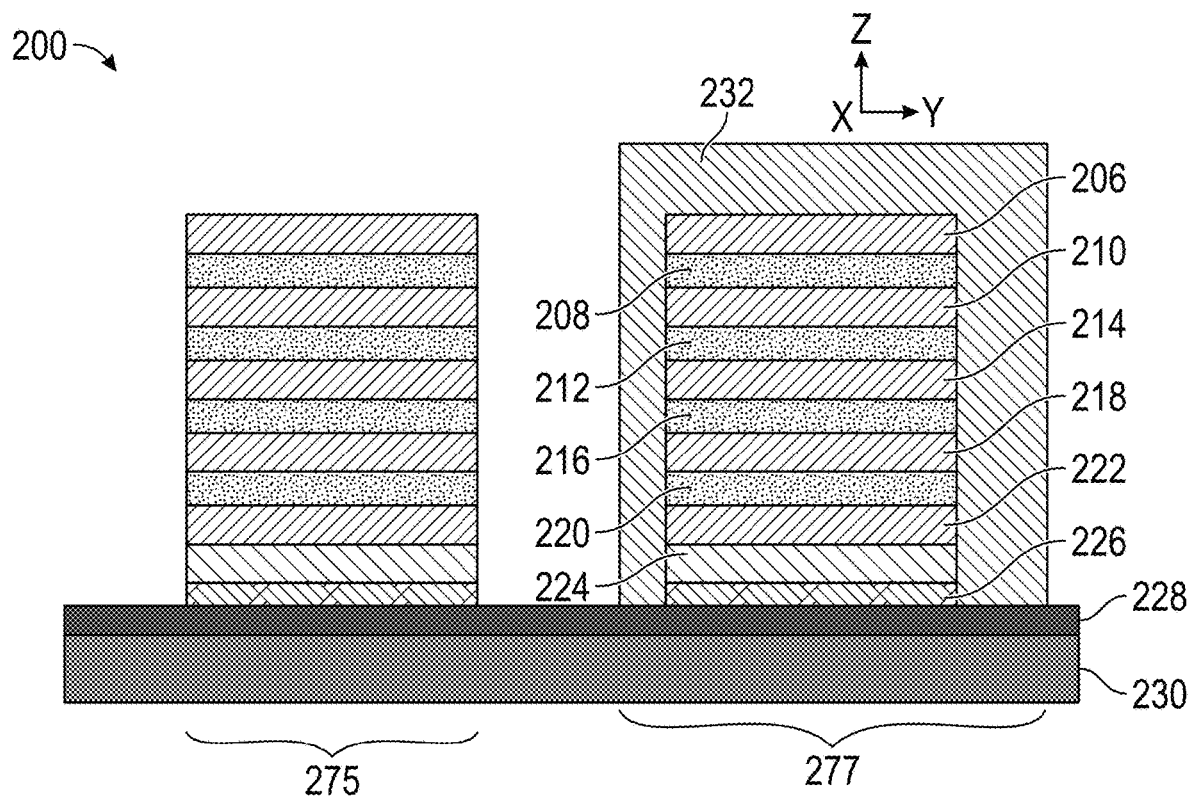

In FIG. 5, a photoresist mask 232 covers the second nano sheet stack 277, which is the GAA nano sheet region. In this way, the first nano sheet stack 275 for the block nano sheet stack can be implanted by plasma for a future NMOS transistor. The implant species can be, but not limited to, phosphorus (P) or arsenic (As).

A similar implant process can be used for PMOS devices. Example implant species for PMOS include, but not limited to, P and As, with a dose range of 5E12 to 5E16 ions/cm2. A similar mask formation can be used for doping GAA nano sheet region, e.g., the second nano sheet stack 277, to meet a particular circuit specification.

Figure 6:
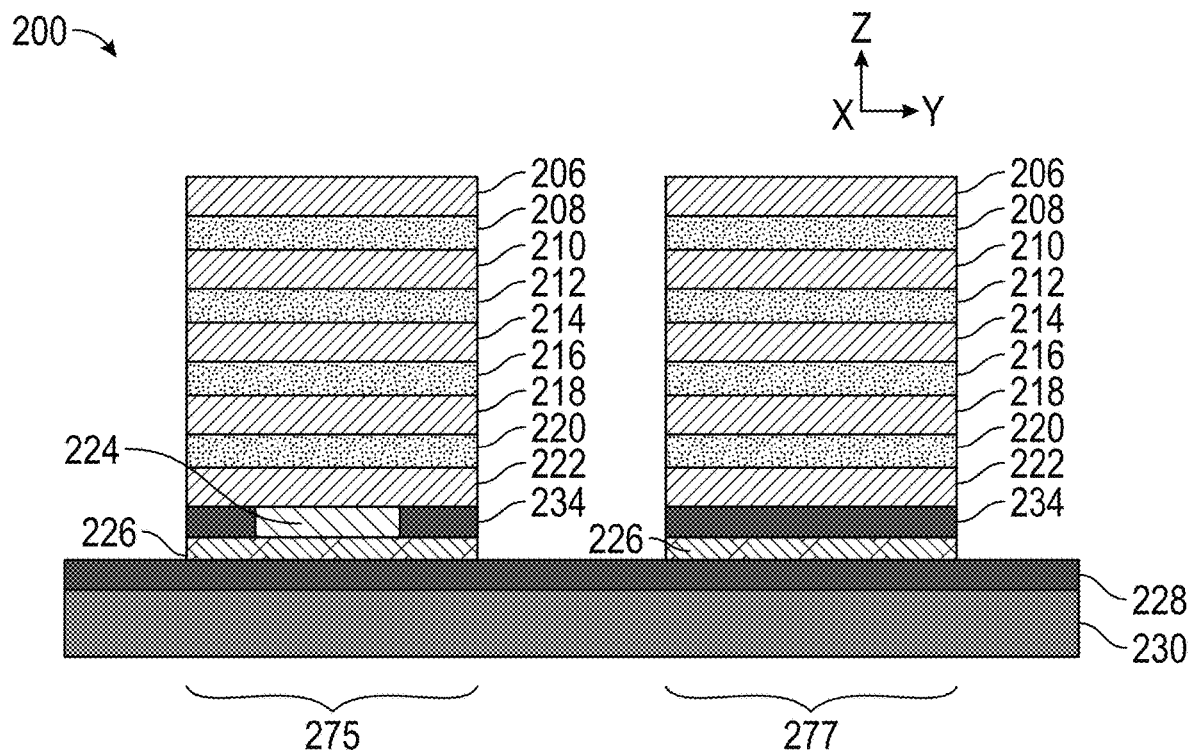

In FIG. 6, the photoresist mask 232 is stripped (mask removed). The process is followed by a complete replacement of SiGe2 layer, e.g., the base SiGe2 layer 224, with dielectric material in the GAA nano sheet stack, e.g., the second nano sheet stack 277. For some embodiments, such as for relatively larger W dimensions, the block nano sheet stack can have only partial removal of the SiGe2. Thus, the base SiGe2 layer 224 is only partial replaced by dielectric material in the block nano sheet stack, e.g., the first nano sheet stack 275.

Figure 7:
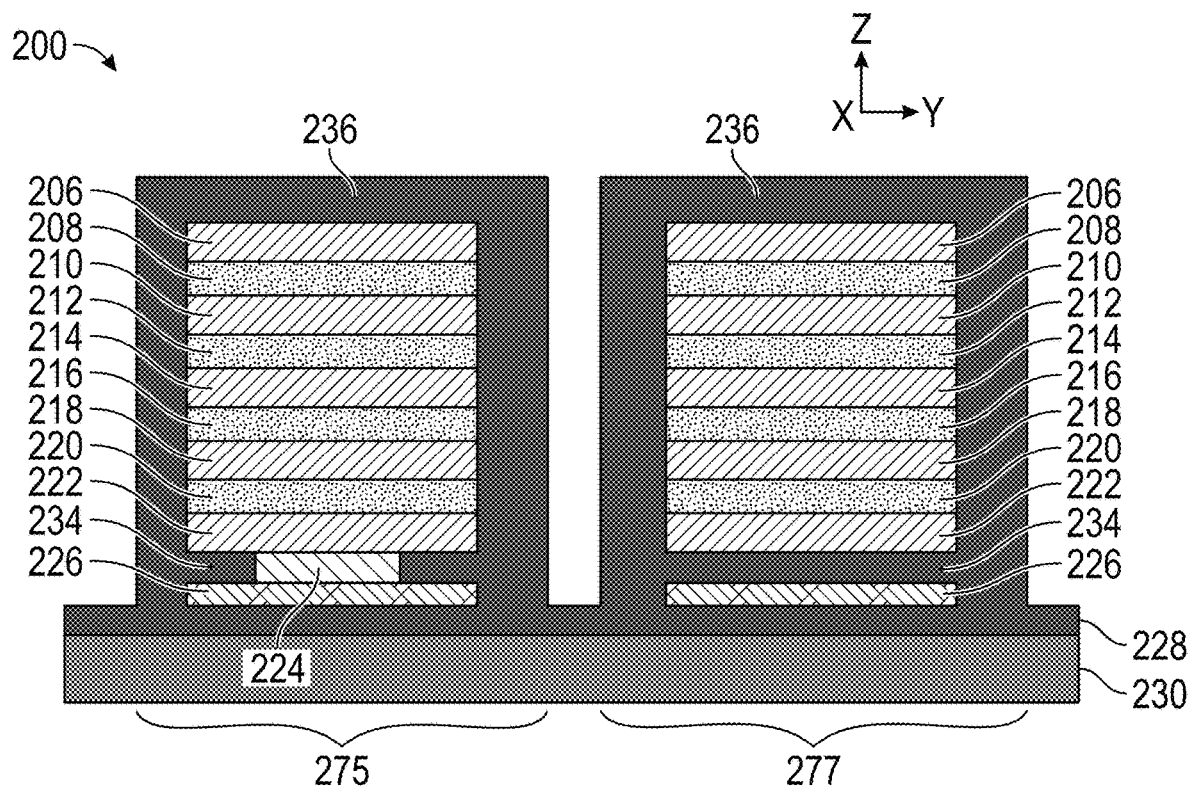

FIG. 7 illustrates high voltage (HV) oxide 236 formations. An example thickness is 50 to 100 Angstroms of dielectric material conformally grown on substrate structures. The process is then followed by a deposition of 50 A to xA. xA is a particular thickness to achieve a desired HV target. The process is then followed by annealing. HV devices typically have 100 to 500 A of gate oxide. A capping layer can optionally be deposited. However, a capping layer is not used in this example embodiment.

The process can continue with a dummy gate formation for the block nano sheet stack and the GAA nano sheet stack, which can define the channel lengths. Note that the low voltage devices will be relatively shorter L devices while the HV and other longer L devices will be the block nano sheet devices.

Figure 8:
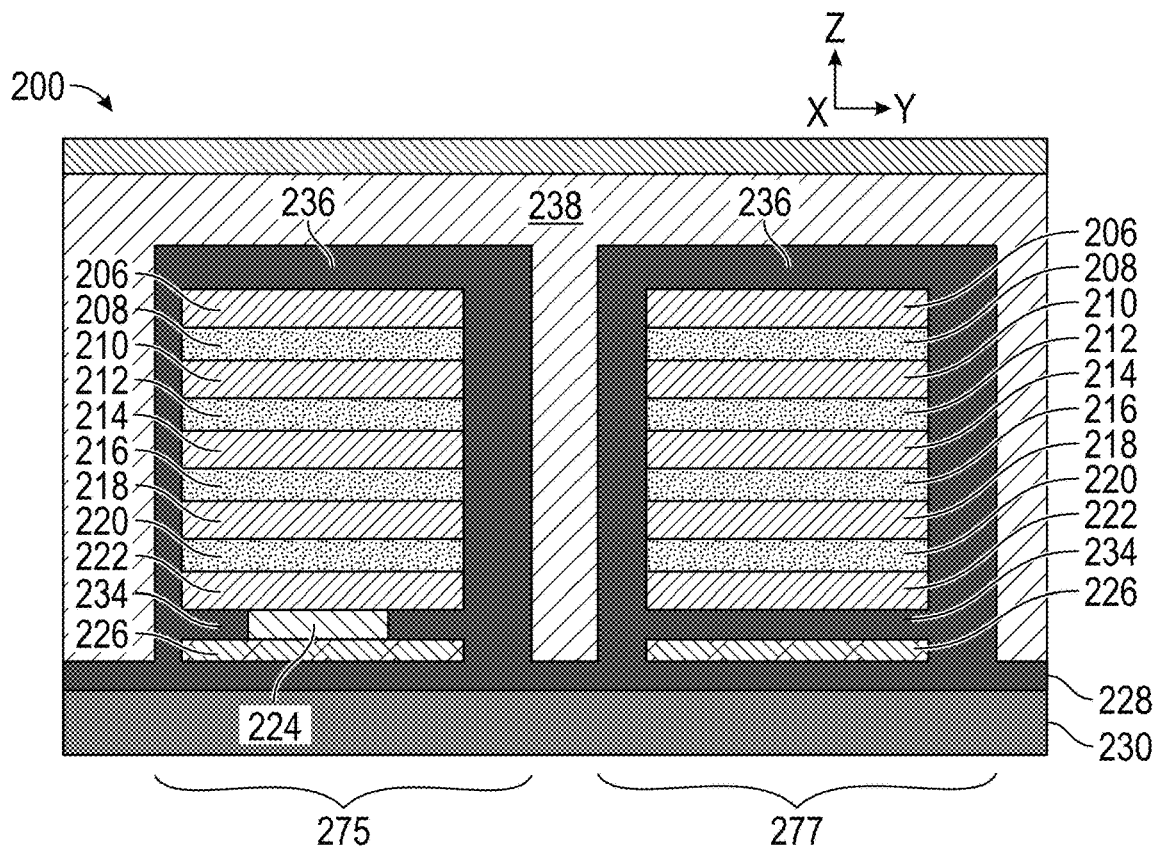

In FIG. 8, deposition can include amorphous poly silicon 238. The process can be followed by a chemical mechanical planarization (CMP) step, and then a nitride layer 240 deposition. The thickness of the amorphous poly silicon 238 can be from 2 nm to 50 nm. The thickness of the nitride layer can be from 2 nm to 50 nm.

Figure 9:
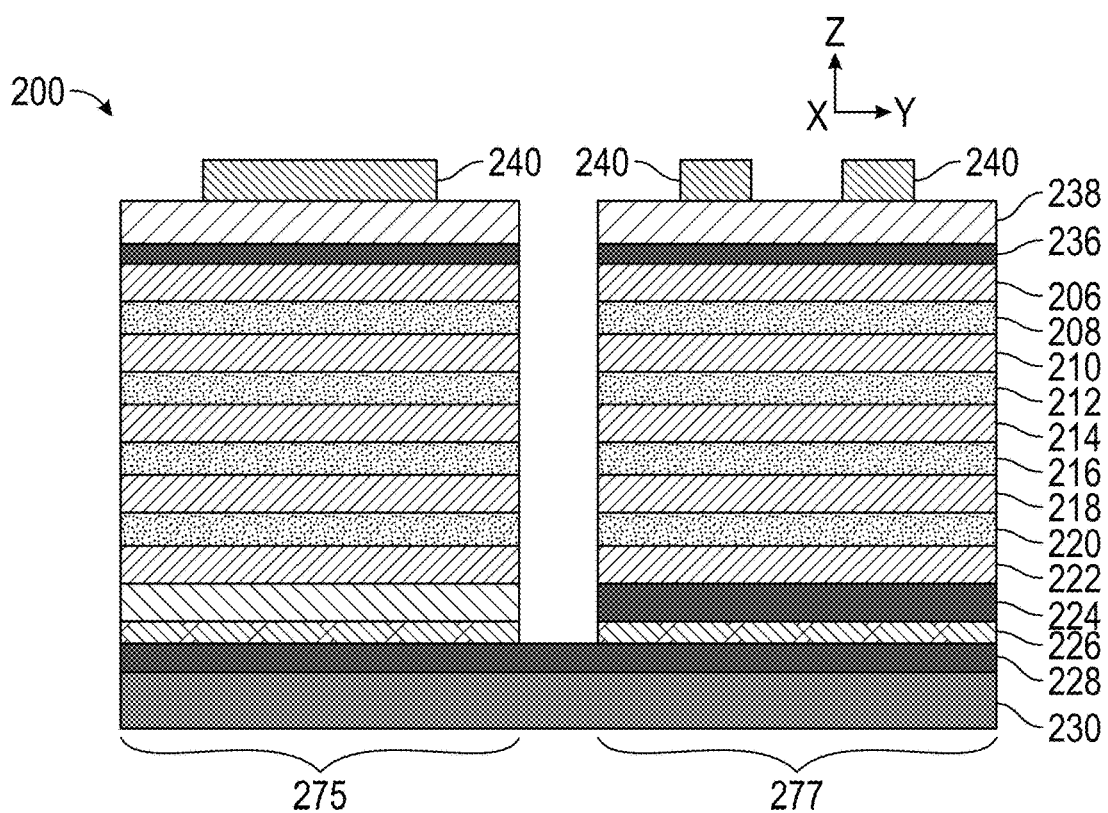

In FIG. 9, for the dummy gate process for LV and HV devices, the nitride layer 240 can be patterned by photolithography to define dimensions of the channel length L for block nano sheet stack, e.g., the first nano sheet stack 275, and GAA nano sheet devices, e.g., the second nano sheet stack 277. The width of the nitride layer 240 in the block nano sheet stack, e.g., first nano sheet stack 275, can be from 10 nm to 200 nm, and the width of the nitride layer 240 in the GAA nano sheet stack, e.g., the second nano sheet stack 277, can be from 2 nm to 100 nm. The nitride layer 240 can be used as a mask layer for the etching process in the following steps.

Figure 10:
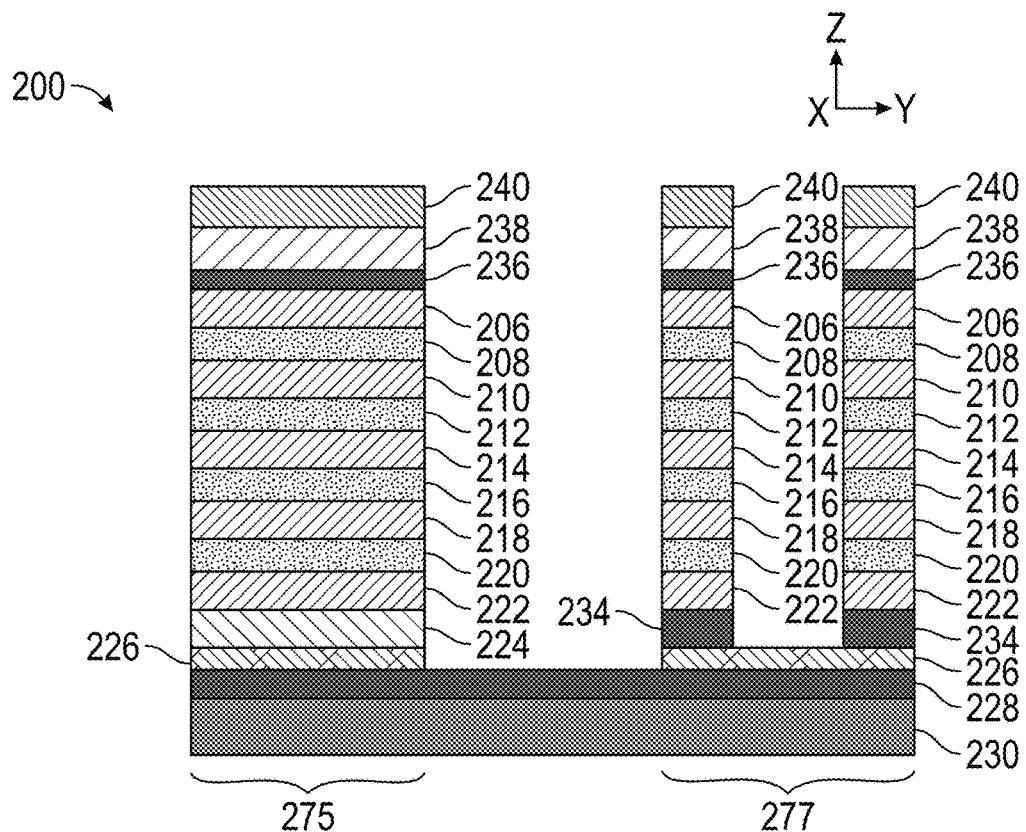

In FIG. 10, the block nano sheet stack 275 can be etched directionally using the nitride layer 240 as an etch mask. The GAA nano sheet stack, e.g., the second nano sheet stack 277, can also be etched directionally using the nitride layer 240 as an etch mask. The etching can be performed by wet etching process or dry etching process. The wet etching process can include, but not limited to, one or more etchants or solutions which can etch nitride and oxide layers. The dry etching process can be performed by, but not limited to, a plasma etching machine. The plasma etching can include one or more chemicals in gaseous state under a high voltage to etch the oxide and nitride layers. The dose can range, but not limited to, from 5E12 to 5E16 ions/cm2.

Figure 11:
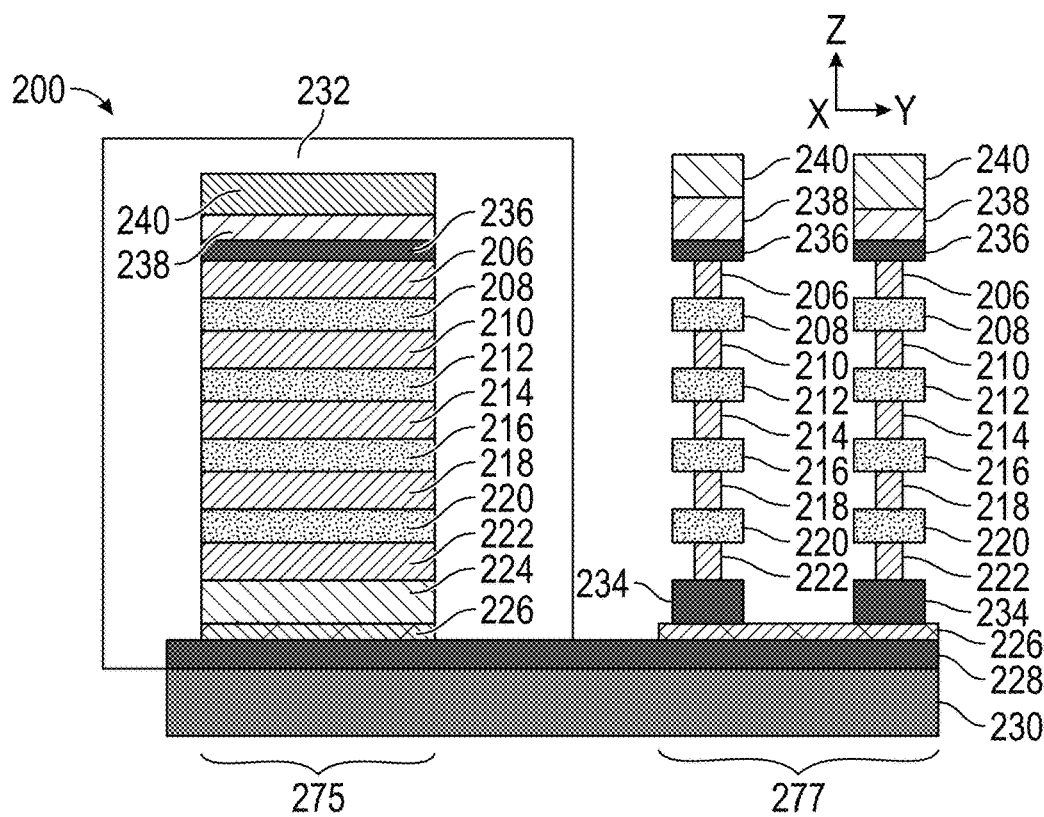
Figure 12:
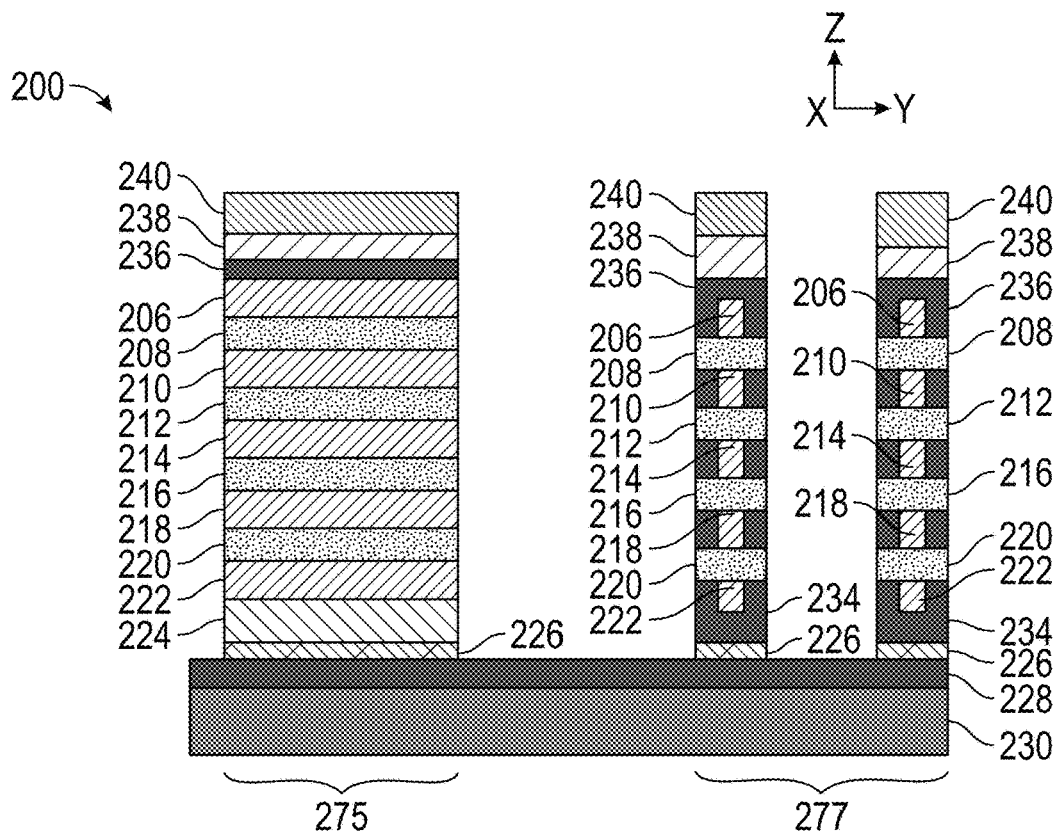

In FIG. 11, the block nano sheet stack, e.g., first nano sheet stack 275, is covered by the photoresist mask 232, such as with photoresist mask. The process is performed while an indent etch of the GAA nano sheet stack, e.g., the second nano sheet stack 277, is executed. This indent etch can use vapor phase isotropic etching to reduce a thickness of the disposable epitaxial material (epitaxial SiGe in this flow). A dielectric deposition is then performed to fill spaces created by the indent etch. The filling can be performed by non-selective filling followed by directional etch using the nitride mask 240 on the GAA nano sheet stack, e.g., the second nano sheet stack 277. Then the photoresist mask 232 on the block nano sheet stack 275 can be removed. The result can be seen in FIG. 12, which shows a formation of inner spacers on the LV devices. However, inner spacers are not needed for the block nano sheet devices because the SiGe does not need to be removed.

Figure 13:
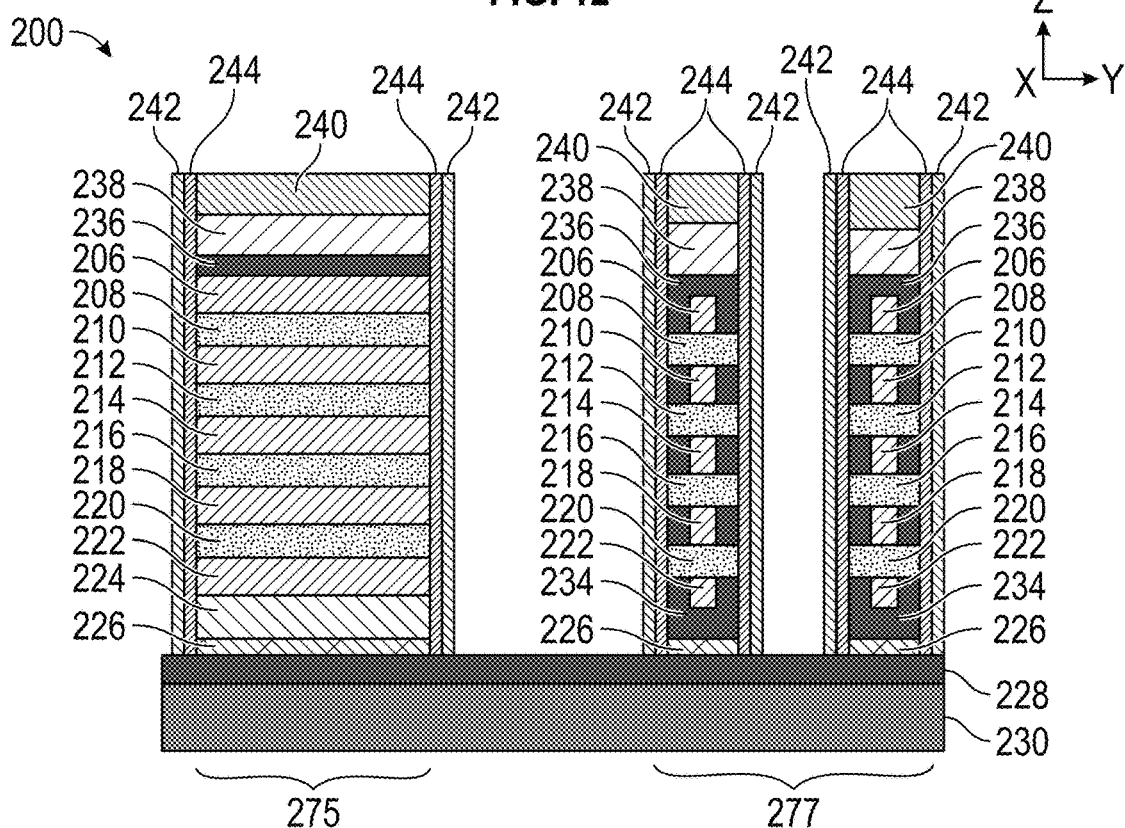

Dielectric spacer formation is shown in FIG. 13 as two layers of sidewall dielectrics 242 and 244 formed on block nano sheet stack, e.g., first nano sheet stack 275, and GAA nano sheet stack, e.g., the second nano sheet stack 277. This dielectric spacer material can be any dielectric selective to the inner spacer dielectric material. In the example, 244 can be a dielectric-2 and 242 can be a nitride spacer. This formation enables growing Source/Drain (S/D) epitaxial material selective for N+ and P+ regions as can be shown in subsequent steps. The thickness of the nitride spacers, e.g., sidewall dielectrics 242, can be from 2 nm to 20 nm, and the thickness of the dielectric-2 244 can be from 2 nm to 20 nm.

Figure 14:
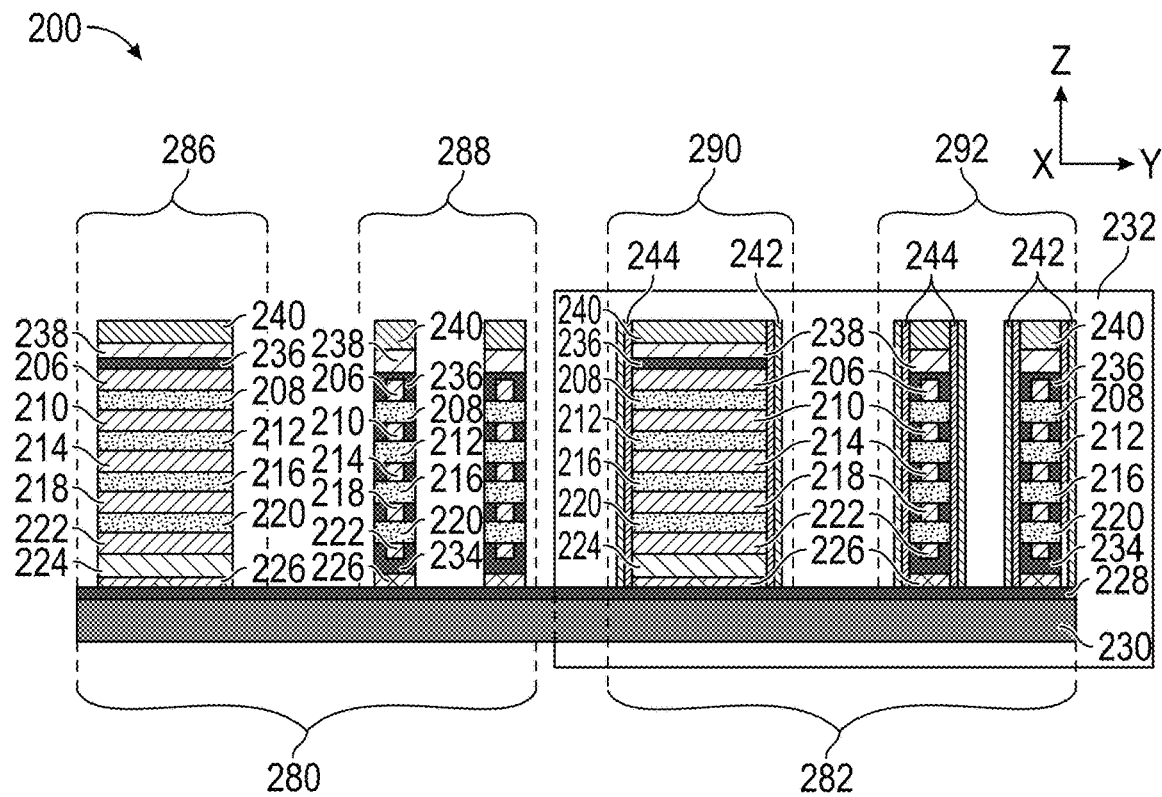

In FIG. 14, future P+ epitaxial region 282 is masked by the photoresist mask 232 while nitride spacers, e.g., sidewall dielectrics 242 and 244, are removed from future N+ epitaxial region 280. The removal can be performed by wet etching process or dry etching process. The wet etching process can include, but not limited to, one or more etchants or solutions which can etch nitride and oxide layers. The dry etching process can be performed by, but not limited to, a plasma etching machine. The plasma etching can include one or more chemicals in gaseous state under a high voltage to etch the oxide and nitride layers. The dose can range, but not limited to, from 5E12 to 5E16 ions/cm2.

In FIG. 14, device 286 is a future block NMOS nano sheet region with a longer channel length high voltage device. Device 288 is a future GAA NMOS nano sheet region with a shorter channel length low voltage device. Device 290 is a future block PMOS nano sheet region with a longer channel high voltage device. Device 292 is a future GAA PMOS nano sheet region with a shorter channel length low voltage device.

Figure 15:
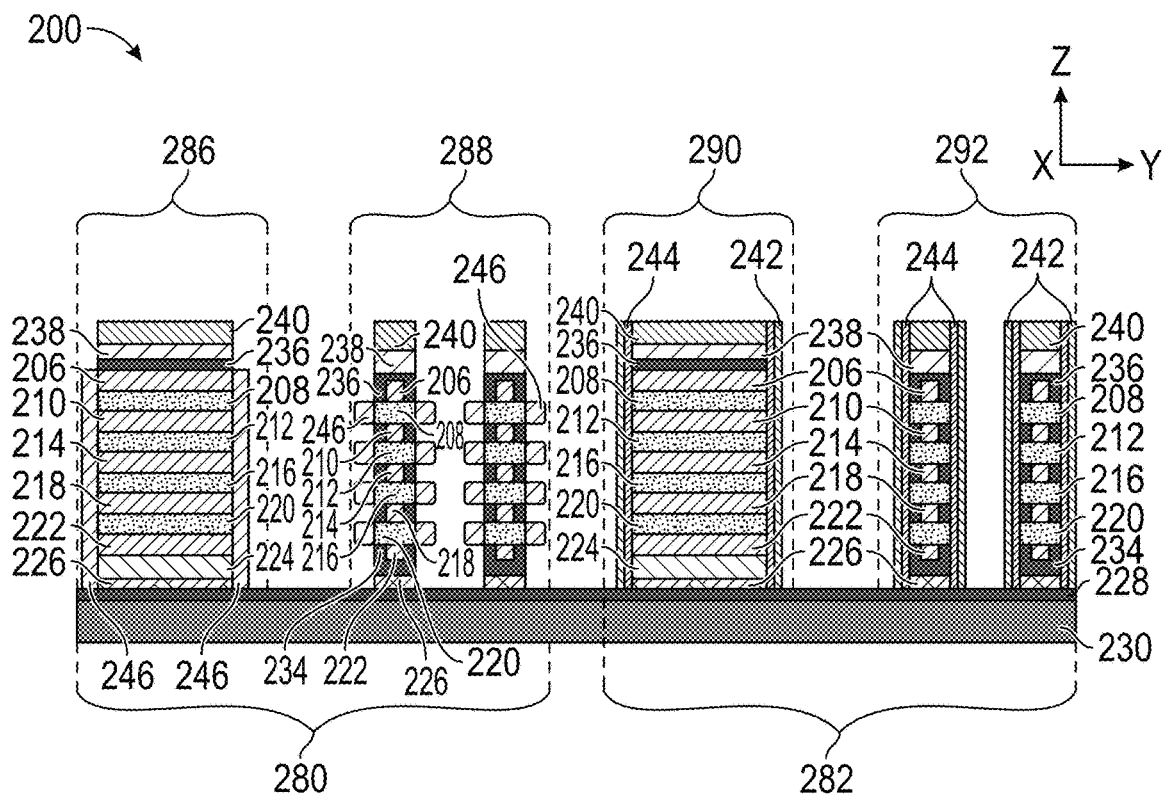

In FIG. 15, N+ epitaxial S/D regions 246 are simultaneously grown on both block nano sheet stack, e.g., device 286, and GAA nano sheet stack, e.g., device 288, of future NMOS devices in the N+ epitaxial region 280. Note that N+ epitaxial material grows on an entire sidewall of the block nano sheet stack, e.g., device 286. The photoresist mask 232 can then be removed from P+ epi stacks in the P+ epitaxial region 282.

Figure 16:
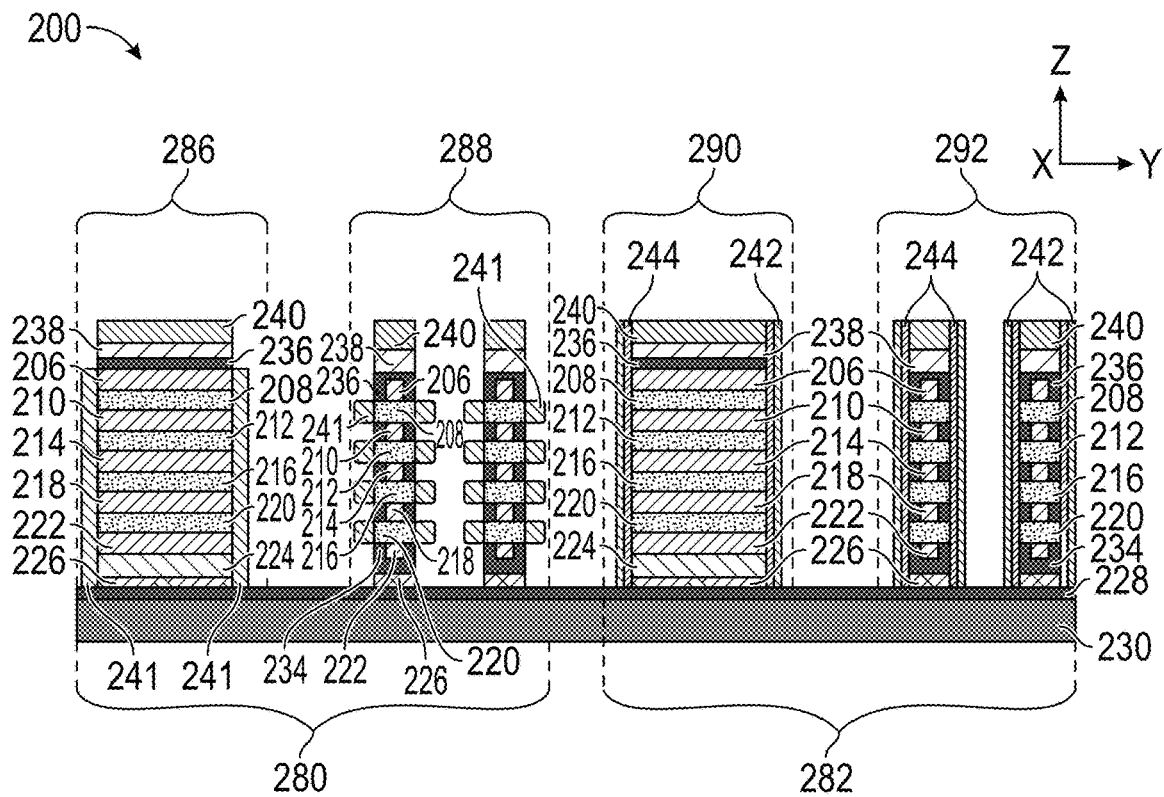

In FIG. 16, a cap layer 241 is formed on N+ source/drain regions only in devices 286 and 288. The deposition of the cap layer 241 can be a selective deposition on only surfaces of the sidewalls of the device 286 and the source/drain regions in device 288. The deposition can be materials such as nitride or a selective high-k material.

Figure 17:
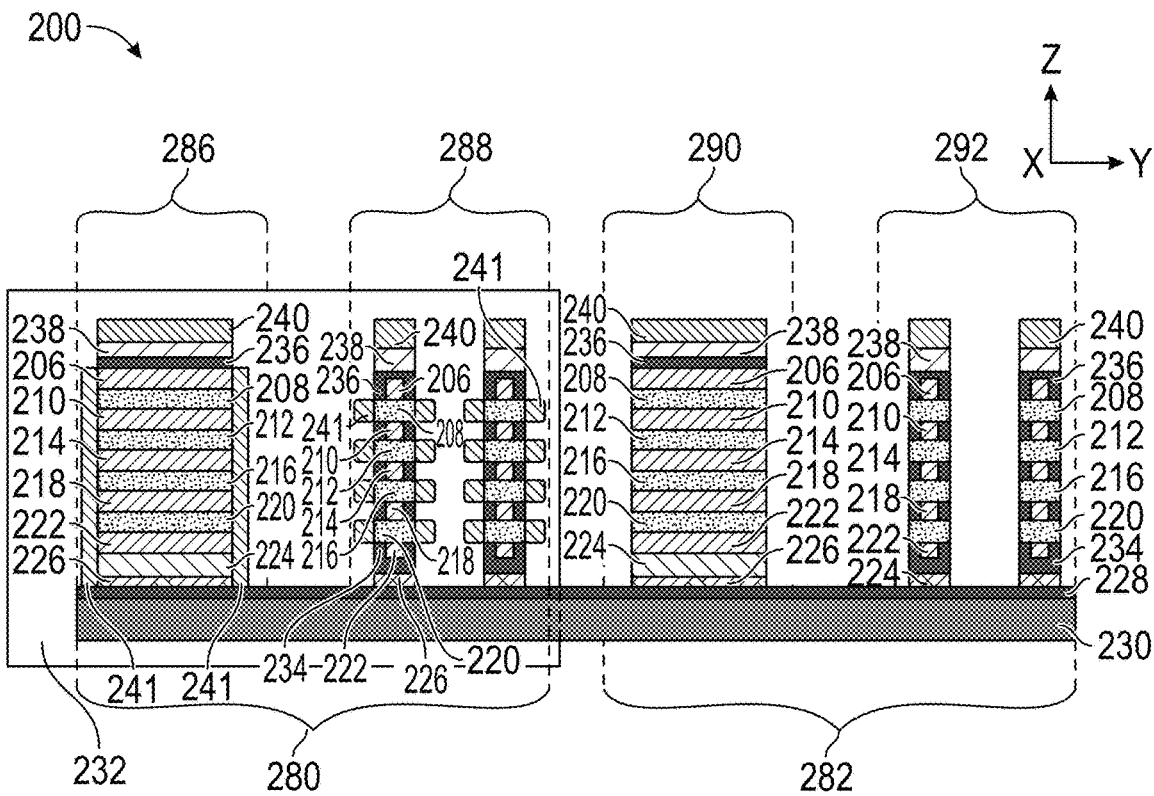

In FIG. 17, with S/D regions of NMOS devices, e.g., devices 286 and 288, capped, the N+ epi stacks or NMOS devices, e.g., devices 286 and 288, are then covered with the photoresist mask 232. In P+ epi stacks or PMOS devices, e.g., devices 290 and 292, the spacers, e.g., sidewall dielectrics 242 and 244, are removed. The removal can be performed by wet etching process or dry etching process. The wet etching process can include, but not limited to, one or more etchants or solutions which can etch nitride and oxide layers. The dry etching process can be performed by, but not limited to, a plasma etching machine. The plasma etching can include one or more chemicals in gaseous state under a high voltage to etch the oxide and nitride layers. The dose can range, but not limited to, from 5E12 to 5E16 ions/cm2.

Figure 18:
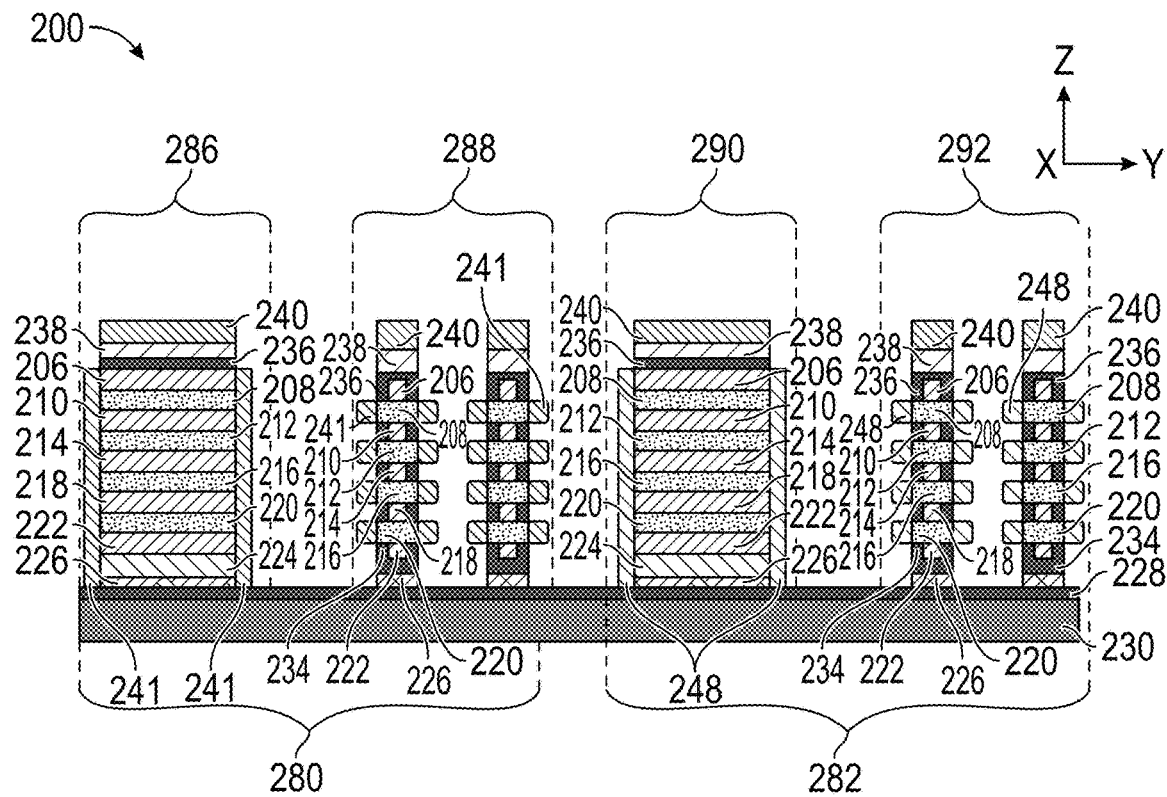

In FIG. 18, P+ epitaxial materials are grown in the source/drain regions for both block 290 and GAA P+ epi stacks, e.g., device 292. The photoresist mask 232 is then removed in the N+ epitaxial region 280. The growing of the P+ epitaxial materials can be performed by selective deposition method, such as boron doped SiGe or boron doped silicon.

Figure 19:
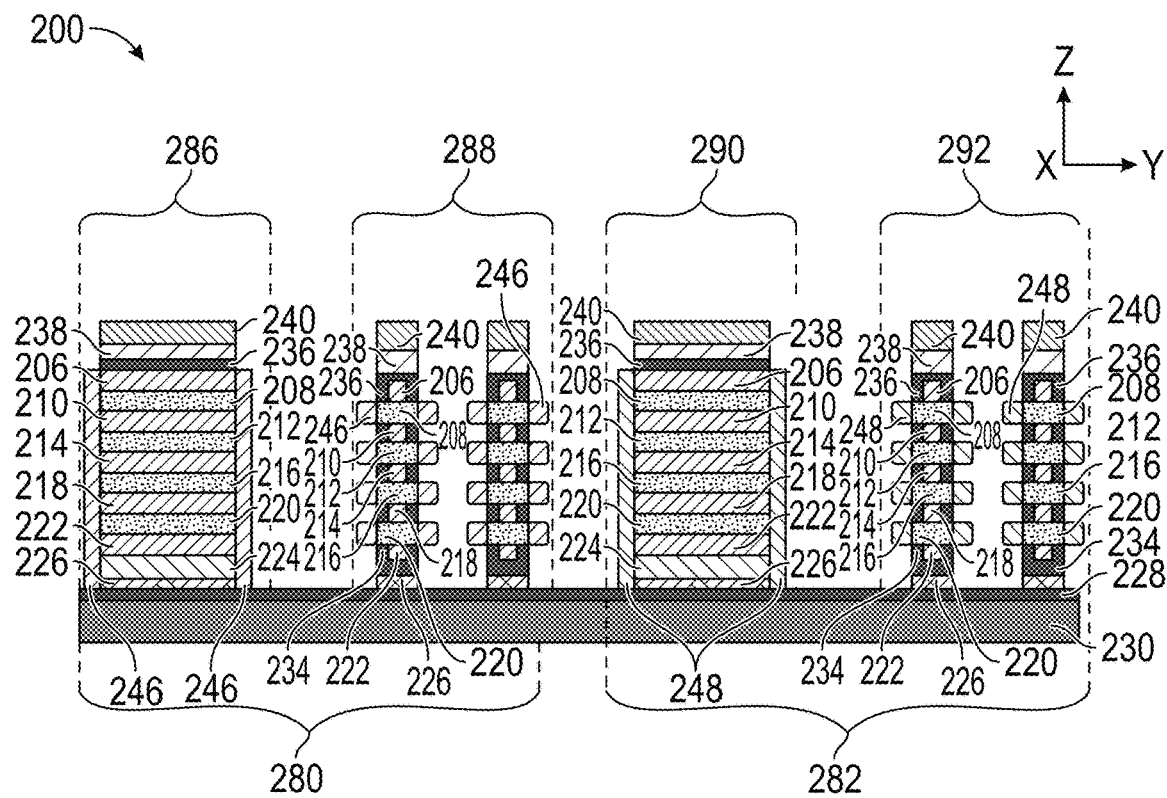

In FIG. 19, the selective capping layer 241 can be removed from N+ Source/Drain regions, e.g., the N+ epitaxial region 280. After both S/D regions are completed, Li (local interconnect) structures can be optionally formed. The removal can be performed by wet etching process or dry etching process. The wet etching process can include, but not limited to, one or more etchants or solutions which can etch nitride and oxide layers. The dry etching process can be performed by, but not limited to, a plasma etching machine. The plasma etching can include one or more chemicals in gaseous state under a high voltage to etch the oxide and nitride layers. The dose can range, but not limited to, from 5E12 to 5E16 ions/cm2.

Figure 20:
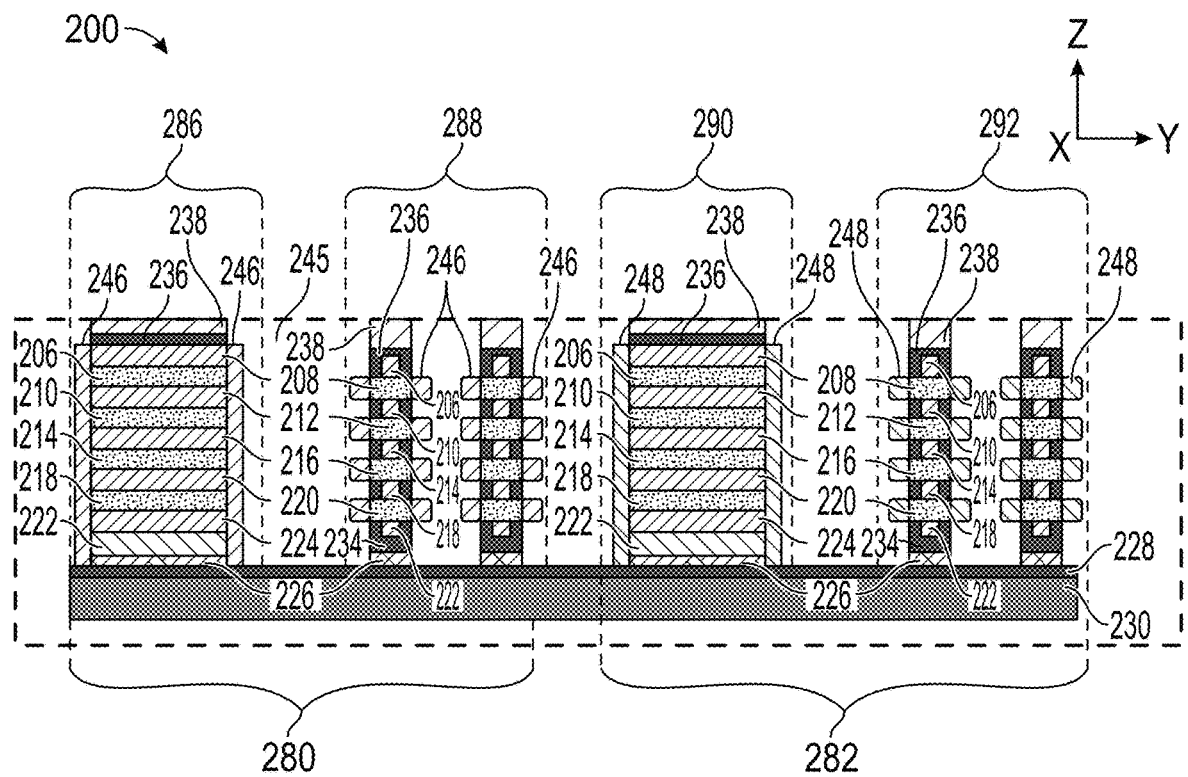

In FIG. 20, a dielectric material 245 is deposited on the device 200. The dielectric materials can be oxide, or the like. The device 200 is then polished by CMP. The CMP process stops on dummy poly silicon layer, e.g., the amorphous poly silicon 238, until the dash line 250.

Figure 21:
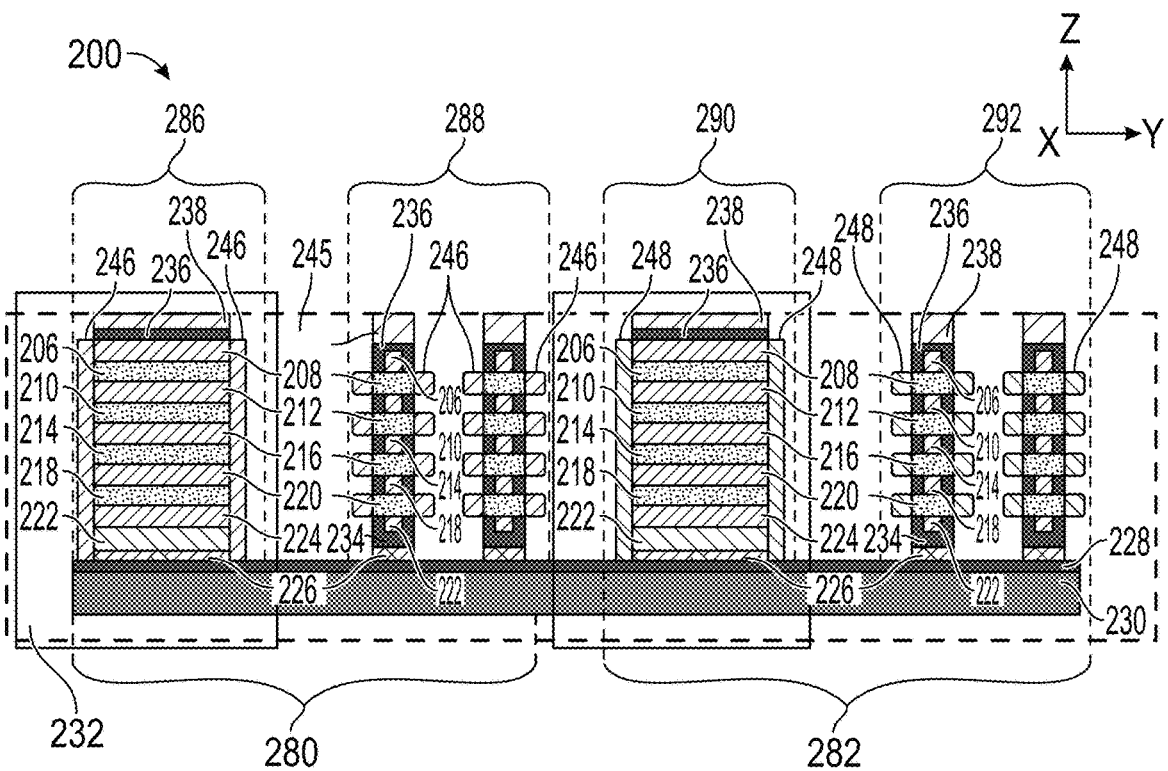

In FIG. 21, a photoresist mask 232 is then formed on block nano sheet stacks, e.g., devices 286 and 290. The GAA nano sheet stack regions are then opened for SiGe channel release.

Figure 22:
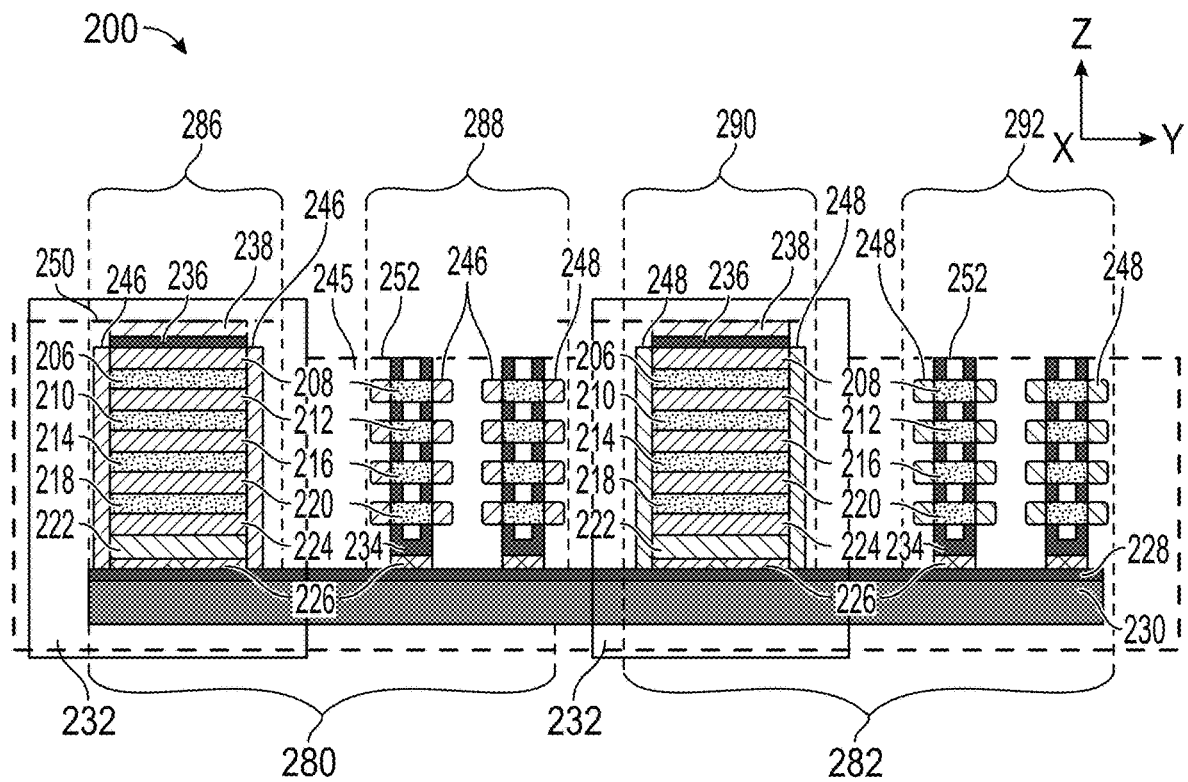

In FIG. 22, the dummy poly gate layer, e.g., the amorphous poly silicon 238, is removed on GAA nano sheet stacks, e.g., devices 288 and 292. The SiGe channels are then released. High voltage oxide 236 can also be removed in GAA nano sheet stacks, e.g., devices 288 and 292. The removal of the dummy poly gate, e.g., the amorphous poly silicon 238, and high voltage oxide 236 can be performed by wet etching process or dry etching process. The removal exposes the devices 288 and 292 until the dash line 252. The wet etching process can include, but not limited to, one or more etchants or solutions which can etch nitride and oxide layers. The dry etching process can be performed by, but not limited to, a plasma etching machine. The plasma etching can include one or more chemicals in gaseous state under a high voltage to etch the oxide and nitride layers. The dose can range, but not limited to, from 5E12 to 5E16 ions/cm2.

Figure 23:
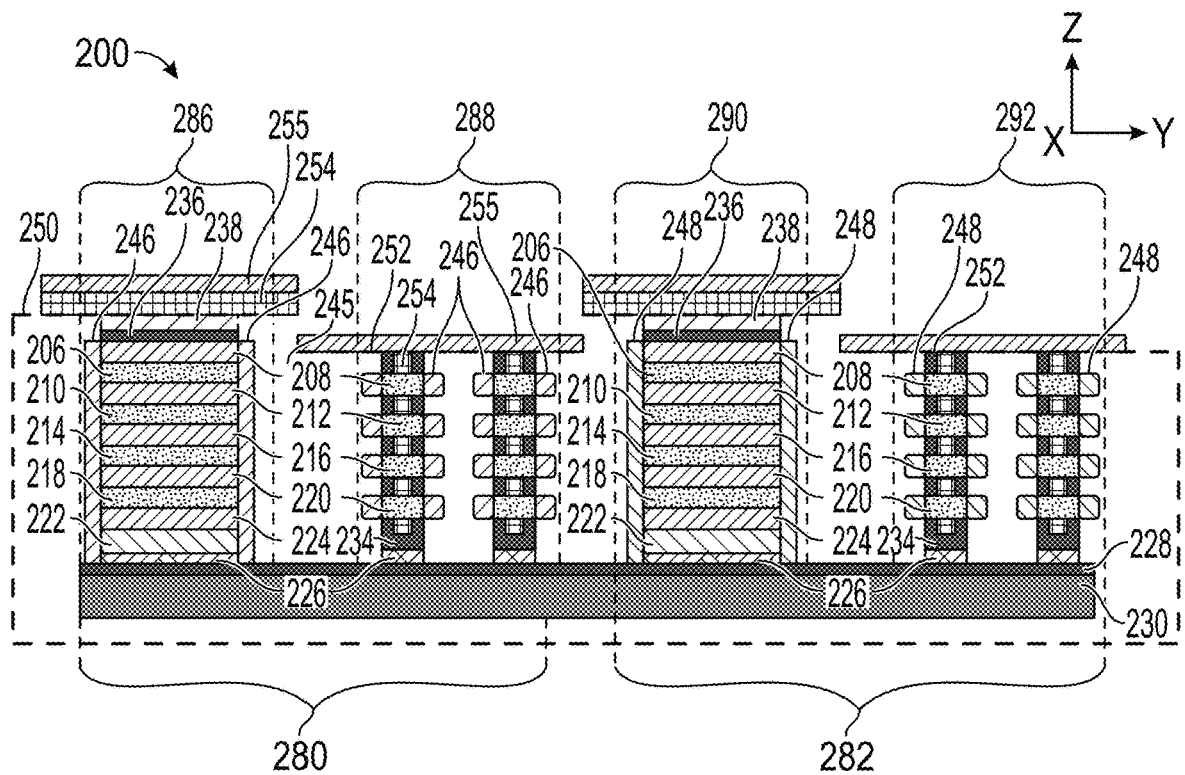

FIG. 23 shows a removal of the photoresist mask 232, and then a metal gate formation is on the device 200. The metal of the metal gate formation process can be filled into SiGe channels, e.g., low voltage gate oxide stack 254, in devices 288 and 292. The metal gate deposition can be deposited on the poly silicon layer, e.g., the amorphous poly silicon 238, in the devices 286 and 290. The metal gate materials can be, but not limited to, TiN/TaN, and TiAl.

A formation of low voltage gate oxide stacks 254 and 255 is performed followed by the metal gate formation. The materials of the low voltage gate oxide stacks 254 and 255 can be, but not limited to, oxide and high-k materials.

Figure 24:
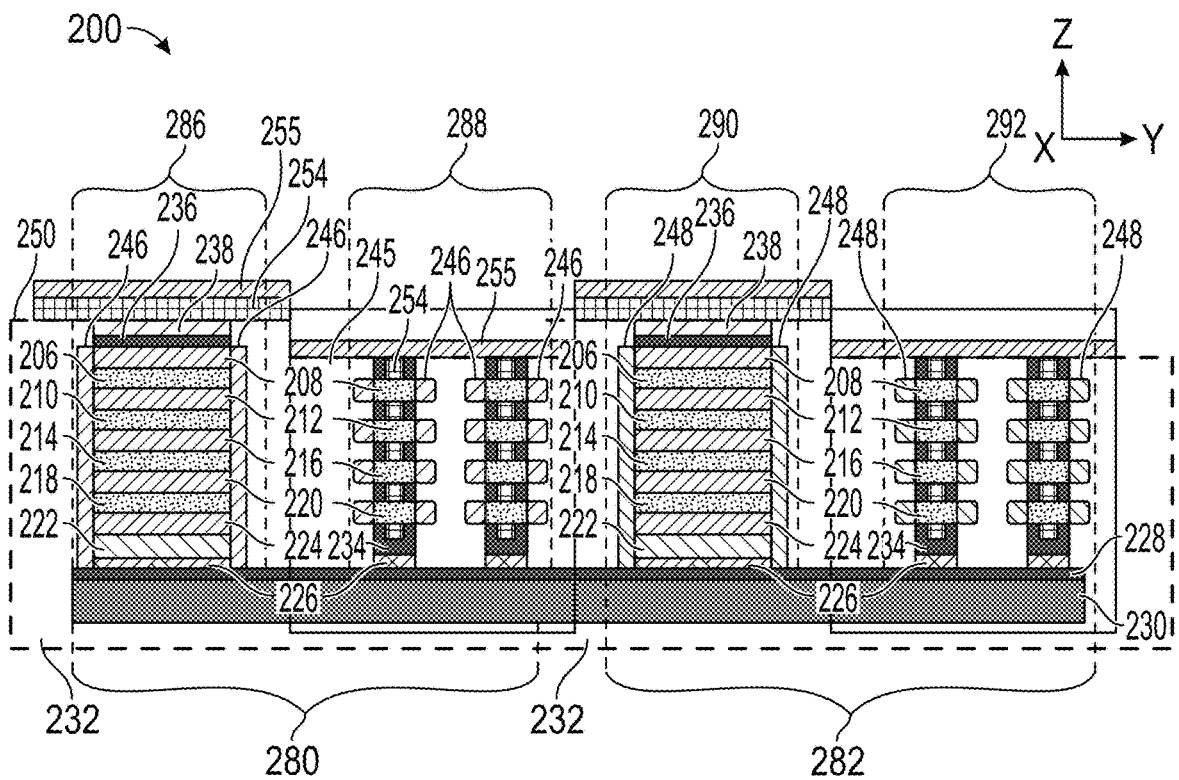

In FIG. 24, devices 288 and 292 in the GAA nano sheet regions are masked by photoresist mask 232. The block nano sheet devices, e.g., devices 286 and 290, in block nano sheet regions are uncovered by the photoresist mask 232 for the next step of the process.

Figure 25:
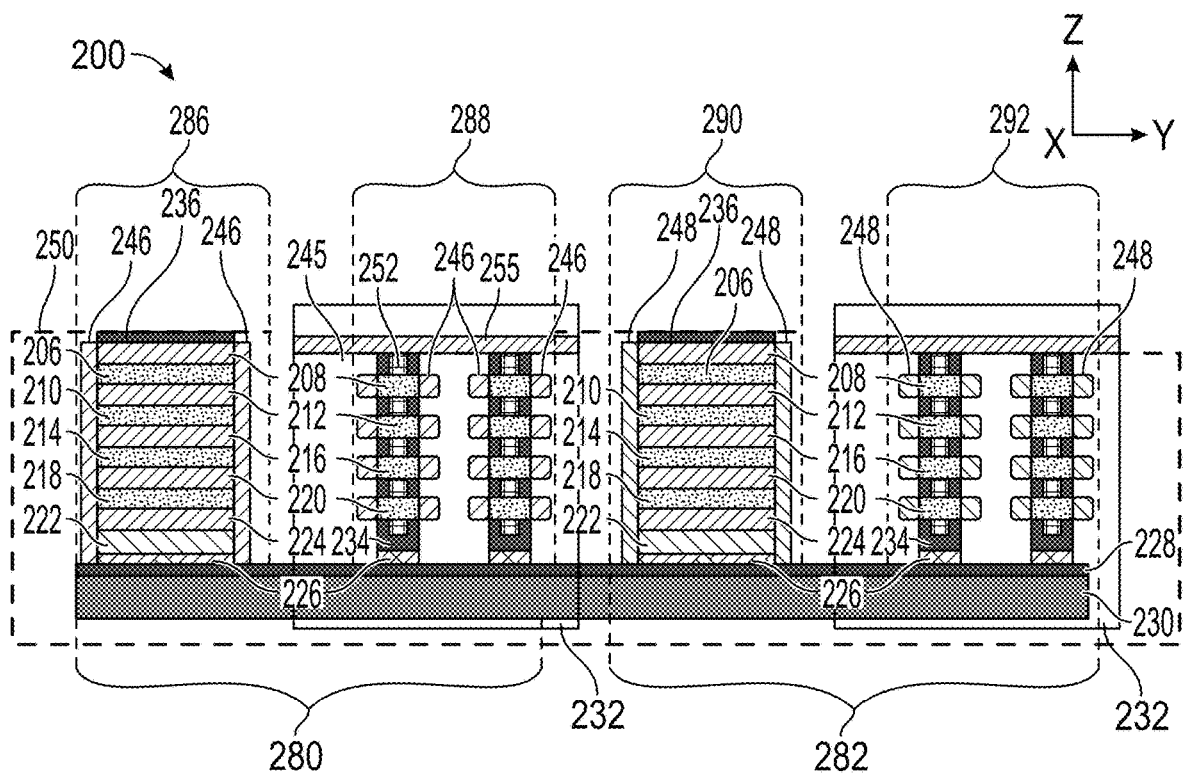

In FIG. 25, oxide cap, e.g., low voltage gate oxide stacks 254 and 255, and amorphous poly layer, e.g., the amorphous poly silicon 238, are removed. The devices 286 and 290 are etched back to high voltage oxide layer 236 in the block nano sheet regions, e.g., devices 286 and 290. The removal of the oxide cap, e.g., low voltage gate oxide stack 255, metal stack 254, and the amorphous poly layer 238 can be performed by wet etching process or dry etching process. The removal exposes the devices 286 and 290 until the dash line 257. The wet etching process can include, but not limited to, one or more etchants or solutions which can etch nitride and oxide layers. The dry etching process can be performed by, but not limited to, a plasma etching machine. The plasma etching can include one or more chemicals in gaseous state under a high voltage to etch the oxide and nitride layers. The dose can range, but not limited to, from 5E12 to 5E16 ions/cm2.

Figure 26:
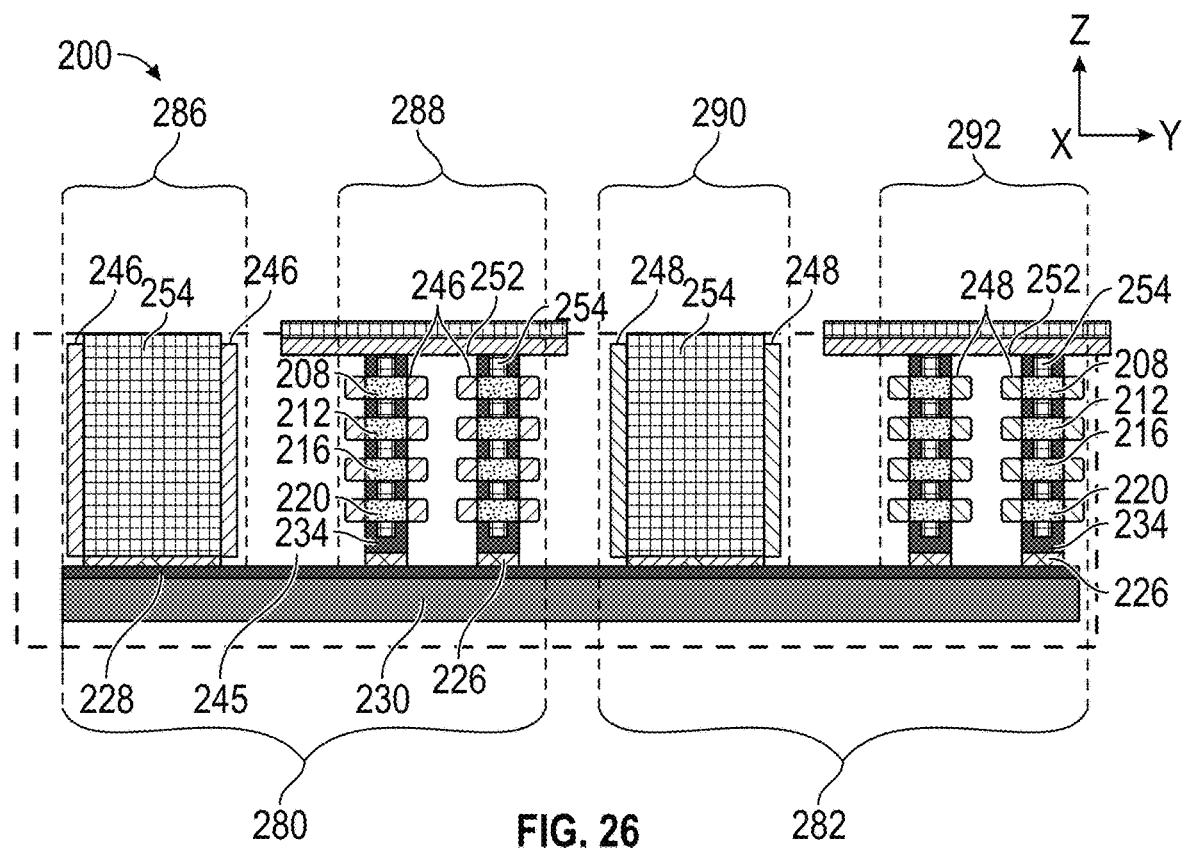

In FIG. 26, a photoresist mask 232 is removed and a second metal stack is deposited. The material of the second metal stack can be the same as, or different from, the metal stack, e.g., low voltage gate oxide stack 254. In the devices 286 and 290, the second metal stack, e.g., low voltage gate oxide stack 254, can be on the blocks to cover the nano sheets regions. In devices 288 and 292, the second metal stack, e.g., low voltage gate oxide stack 254, can be filled into the channel regions.

Figure 27:
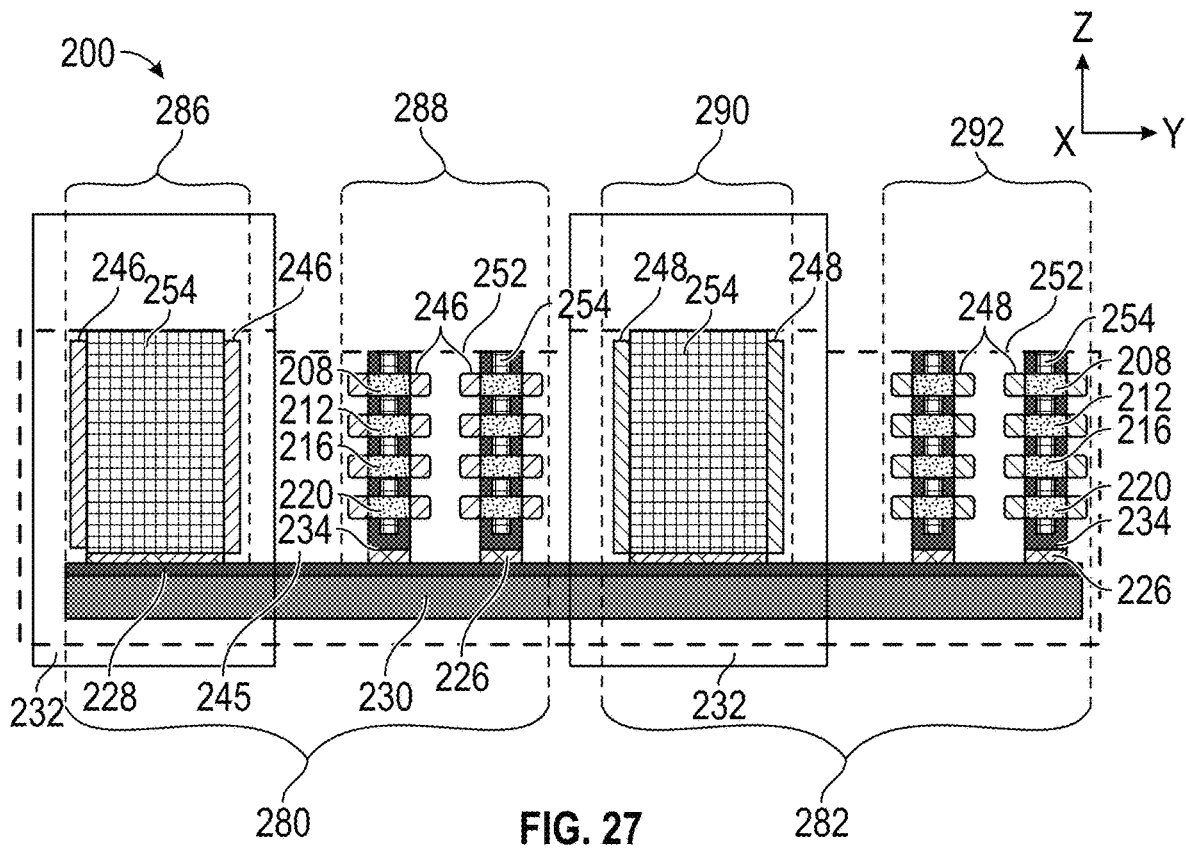

In FIG. 27, the block nano sheet regions, e.g., devices 286 and 290, are masked by a photoresist mask 232. The metal stack, e.g., low voltage gate oxide stack 254, and oxide layer, e.g., low voltage gate oxide stack 255, are removed from the top of the GAA nano sheet devices, e.g., devices 288 and 292.

Figure 28:
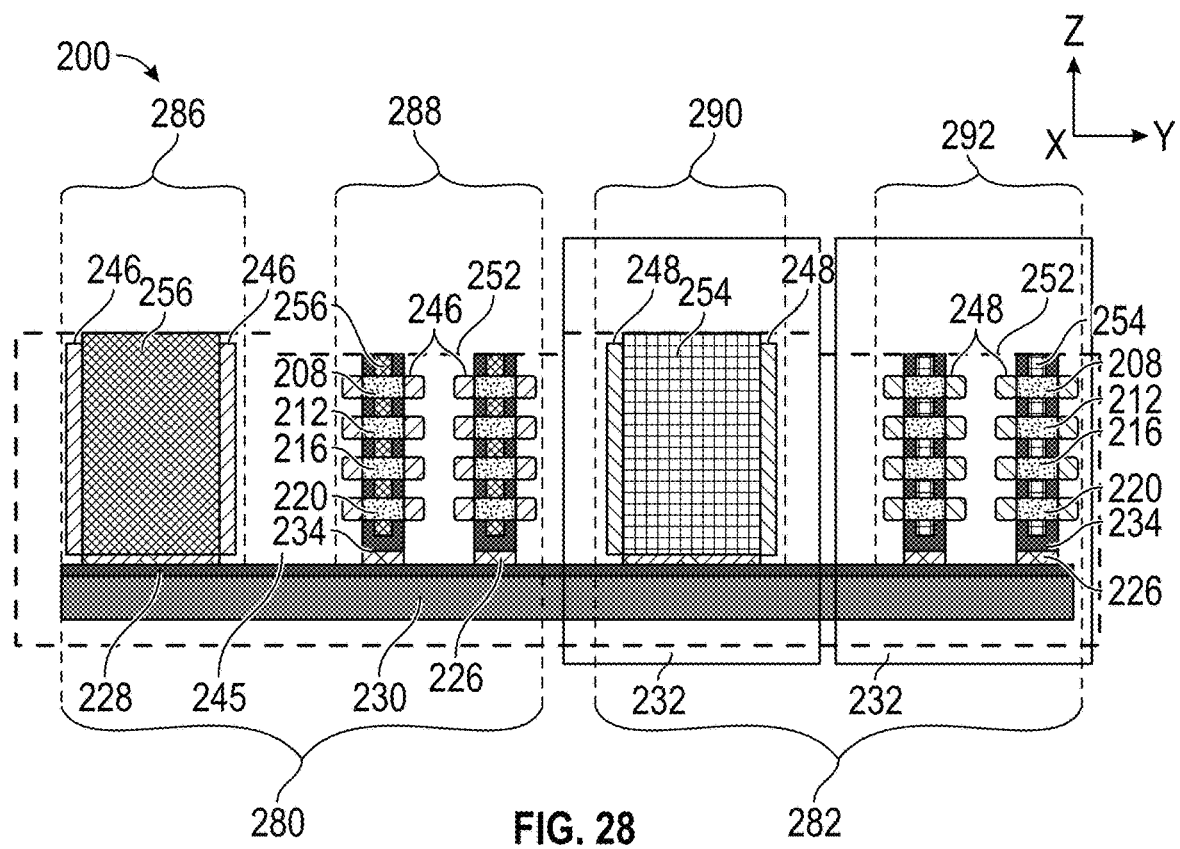

In FIG. 28, a photoresist mask 232 in FIG. 27 is removed. Another photoresist mask 232 is formed to cover up PMOS device regions, e.g., the P+ epitaxial region 282, for both block nano sheet stack, e.g., device 290, and GAA nano sheet stack, e.g., device 292. The metal stack, e.g., low voltage gate oxide stack 254, in NMOS region, e.g., the N+ epitaxial region 280, for both block nano sheet stack 290 and GAA nano sheet stack, e.g., device 292, is removed. A second metal stack 256 is then deposited on the regions where the metal stack, e.g., low voltage gate oxide stack 254, is removed. The second metal stack materials can be, but not limited to, TiN/TaN, and TiAl.

Figure 29:
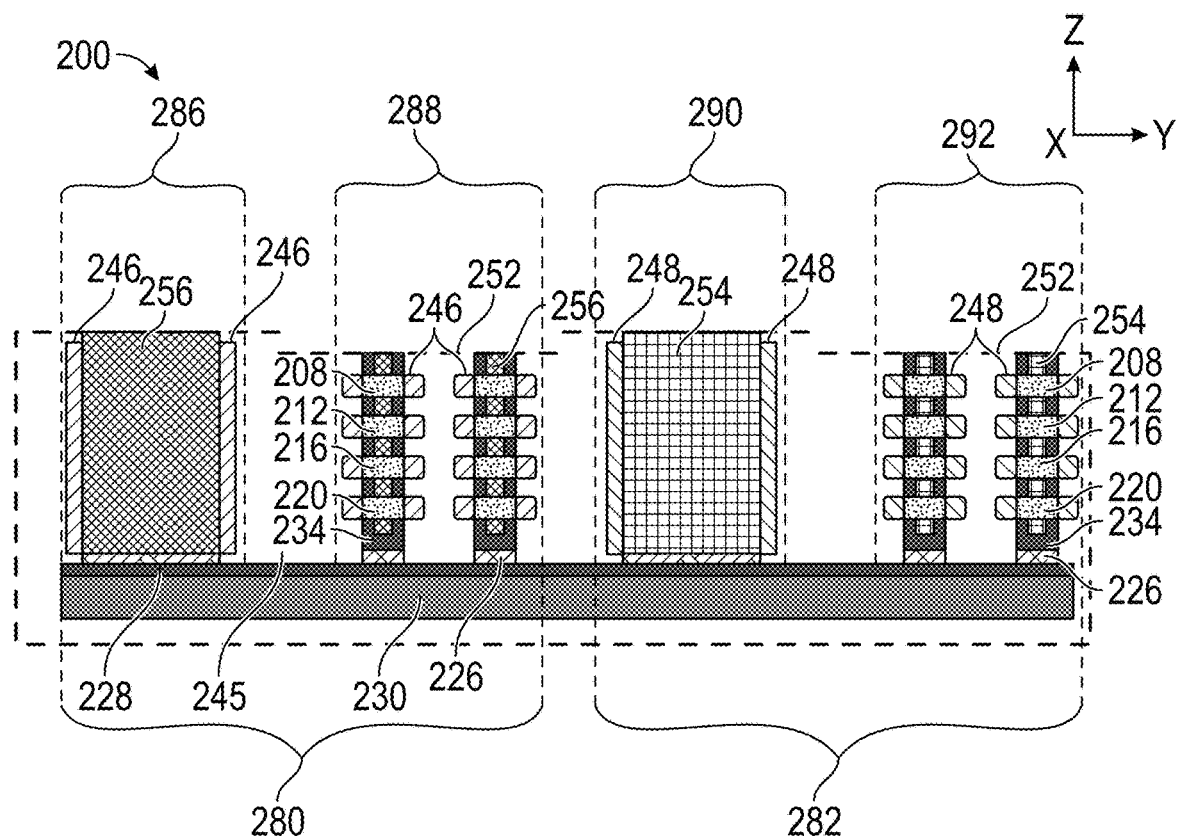

In FIG. 29, a photoresist mask 232 in the FIG. 28 is removed. A final dual work function configuration for both block nano sheet stacks, e.g., devices 286, 290, and GAA nano sheet stacks, e.g., devices 288, 292, is presented. The process can then continue with metallization such as M0 and M1 formation.

An alternative embodiment uses a silicon substrate wafer instead of silicon on insulator wafer (SOI wafer). The embodiment of the current process flow keeps the base SiGe2 layer intact for the block nano sheet. The GAA nano sheet device has SiGe2 layer removed and then replaced with dielectric material. The process flow includes making a well substrate doping background in the NMOS (P-type well) and PMOS (n-type well). The embodiment uses a well tap connection that is achieved with a buried power rail in substrate as one example. Another example is the well tap connection may be achieved from metal connection between transistors. The embodiment of the process flow enables any size W (transistor width) or L (transistor length) for the block nano sheet device. The GAA nano sheet device allows for L and W to be restricted to less than 150 nm and is co-integrated with the block nano sheet.

This alternative embodiment has many common processing steps with the first embodiment so previous figures are used. Embodiments can have multiple implanted regions in the substrate for NMOS and PMOS regions (implanted regions not needed with substrate is insulated with oxide).

In general, process flow includes the following. A substrate implant for NMOS and PMOS regions. A formation of nano stacks. An optional formation of buried power rail. A nano sheet stack etch to define W (no restrictions on W for block nano sheet). A channel implantation option. A removal of SiGe2 and a replacement with dielectric materials. A high voltage gate dielectric material formation on all devices. An amorphous poly silicon deposition, planarization by CMP, and then a nitride deposition. A dummy gate process for low voltage and high voltage devices. An oxide deposition and polishing. A final gate dielectric metal gate for NMOS/PMOS modules. Metallization for M0 and M1 formation with substrate contact with NMOS and PMOS.

Figure 30:
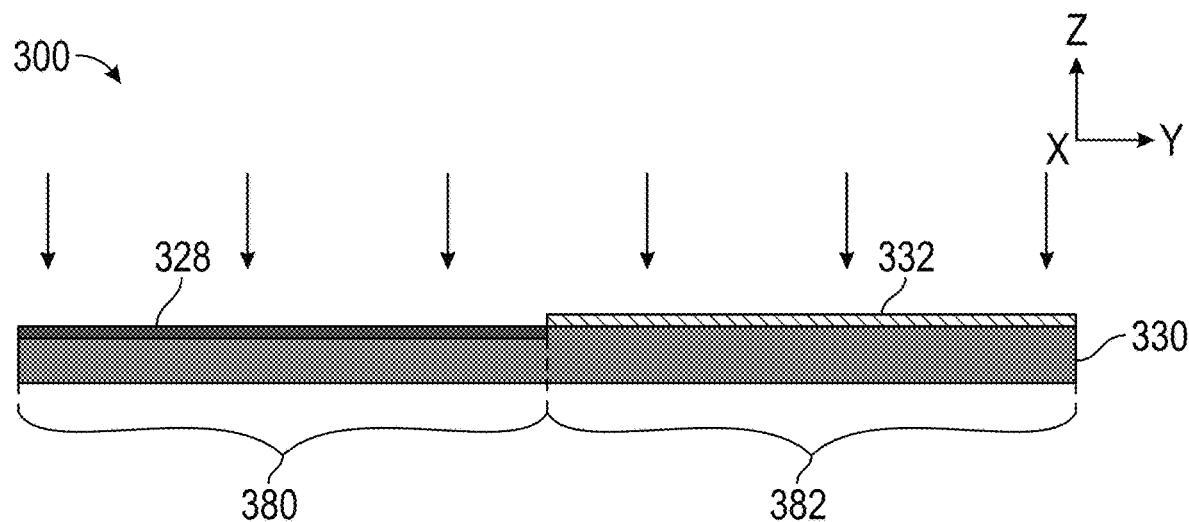
FIGS. 30-38 are cross-sectional views of a semiconductor device at various intermediate steps of a second manufacturing process, in accordance with exemplary embodiments of the disclosure.

FIG. 30 illustrates a substrate 330 implantation for future NMOS region 380. A portion of the substrate 330 is masked by photoresist 332. The substrate is then followed by three boron implantations. Example energy can be E1=300 Kev, E2=150 keV, E3=30 keV, with a dose range from 5E12 to 5E14 ions/cm2. Note that for energy over 100 KeV, the energy may be adjusted by +−40 keV; energy under 50 Kev may be adjusted by +−20 KeV. Also note Boron is given as embodiment example but any P-type dopant can be used. The region 382 can be a future PMOS region.

Figure 31:
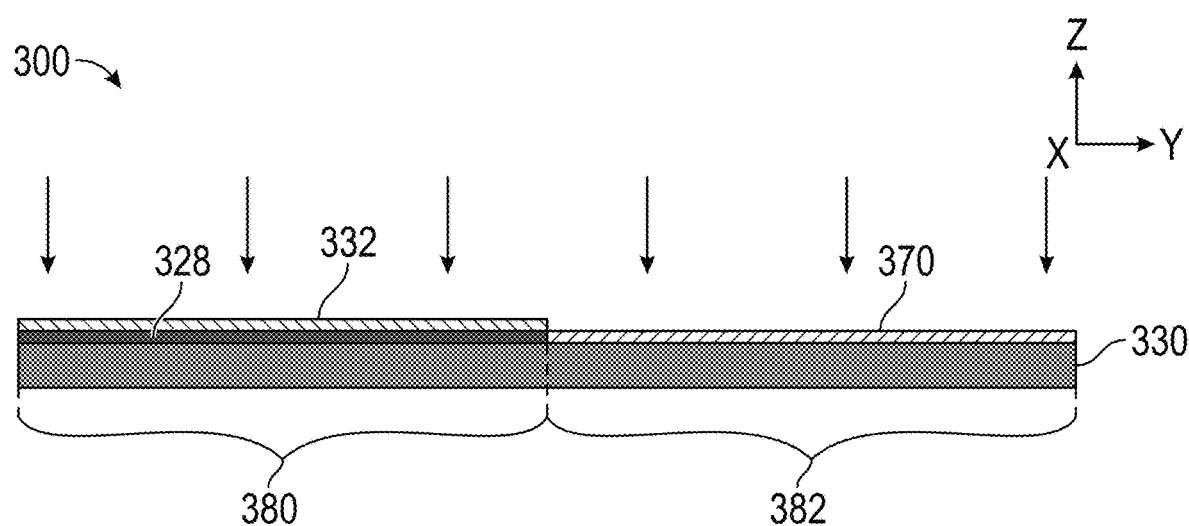

FIG. 31 illustrates a substrate implantation for future PMOS region 382. A portion of the substrate 330 is masked by photoresist 332. The substrate is then followed by three phosphorous implantations. Example energy can be E1=600 Kev, E2=300 keV, E3=30 keV, with a dose range from 5E12 to 5E14 ions/cm2. Note that for energy over 100 KeV, the energy may be adjusted by +−80 keV; energy under 50 KeV may be adjusted by +−20 KeV. Also note phosphorous is given as embodiment example but any N-type dopant can be used.

Figure 32:
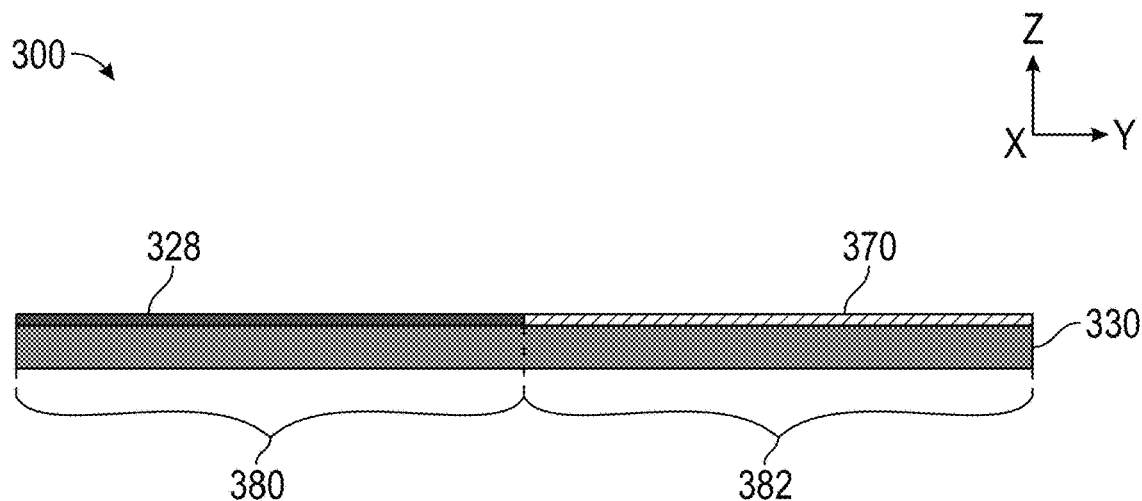

FIG. 32 shows a substrate with both NMOS region 380 and PMOS region 382 with the photoresist 332 removed.

The substrate 330 can be annealed at 800 C to 1000 C with a time range from 1 to 30 minutes.

Figure 33:
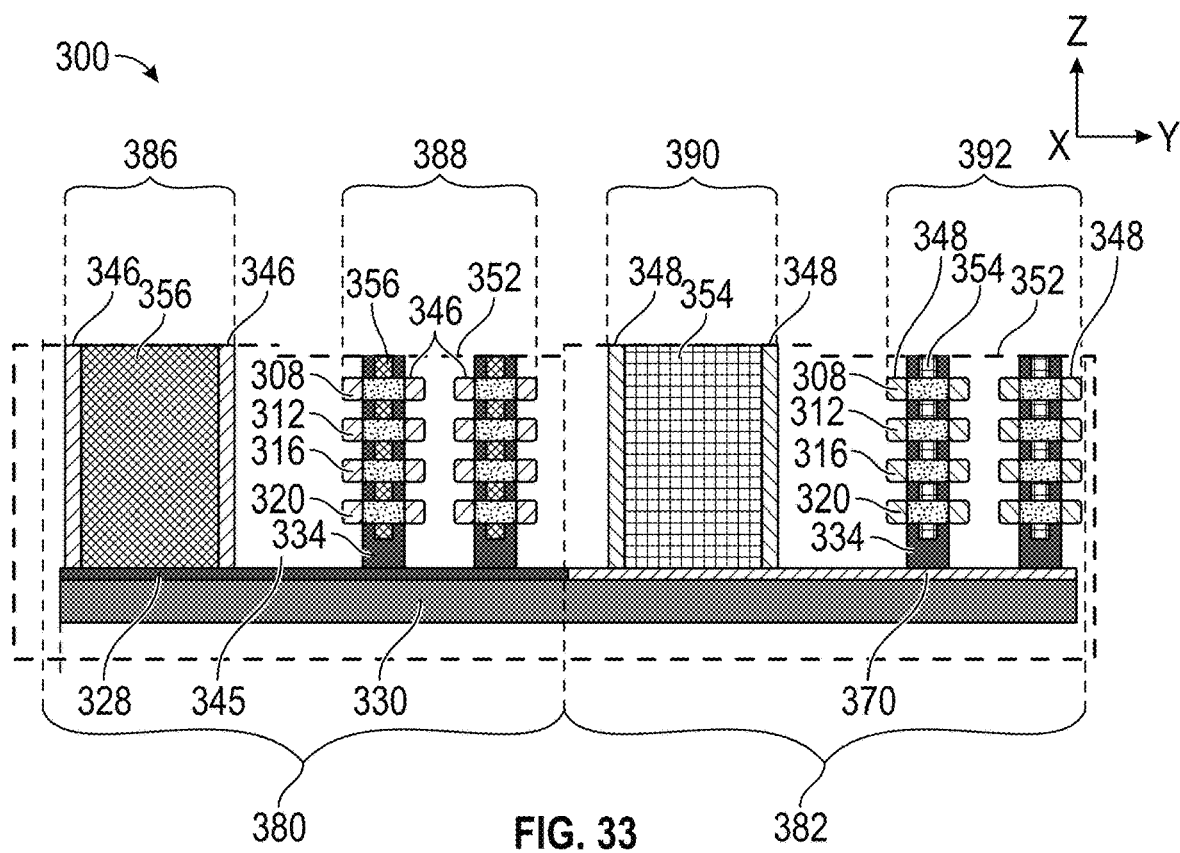

FIG. 33 shows nano sheet stacks using SiGe/Si/SiGe/Si stack. Note that nano sheet stacks can also be SiGe2/Si/Ge/Si/Ge for Ge channels. Thus, any stack is possible with embodiments herein, and different types of stacks can be used on a same wafer surface.

The process flows of fabricating the device 300 is similar to the process flows described in FIGS. 2-29.

Figure 34:
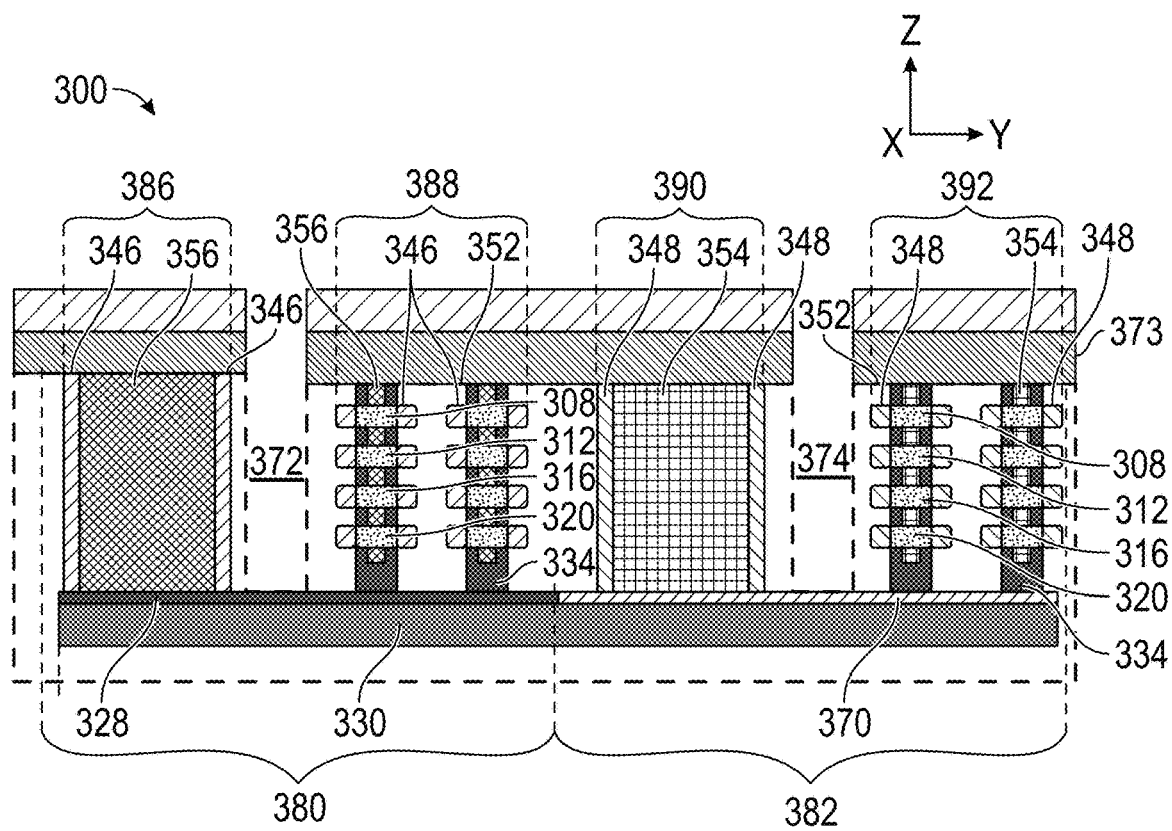

Next in the process, oxide 373 can fill the device 300. The device 300 is then be planarized by CMP process. A layer of photoresist mask 371 deposited. FIG. 34 shows a formation of the photoresist mask 371 for contact openings 372 and 374. The contact openings 372 and 374 can be used for contacts in N+ or P+ implant region.

Figure 35:
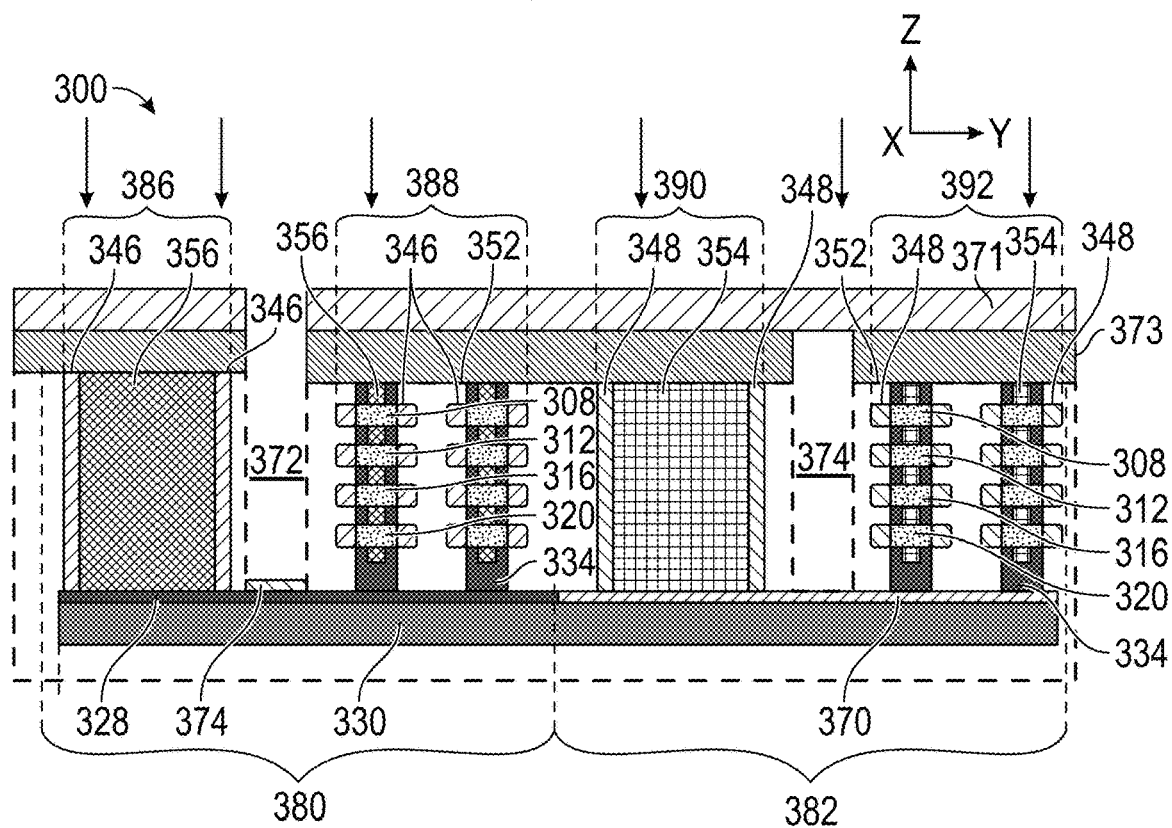

In FIG. 35, N+ well, e.g., contact opening 372, tie plasma implant is performed and a N+ implanted region is shown in 374. Dose of the implantation can be, but not limited to, 5E15 to 5E16 arsenic.

Figure 36:
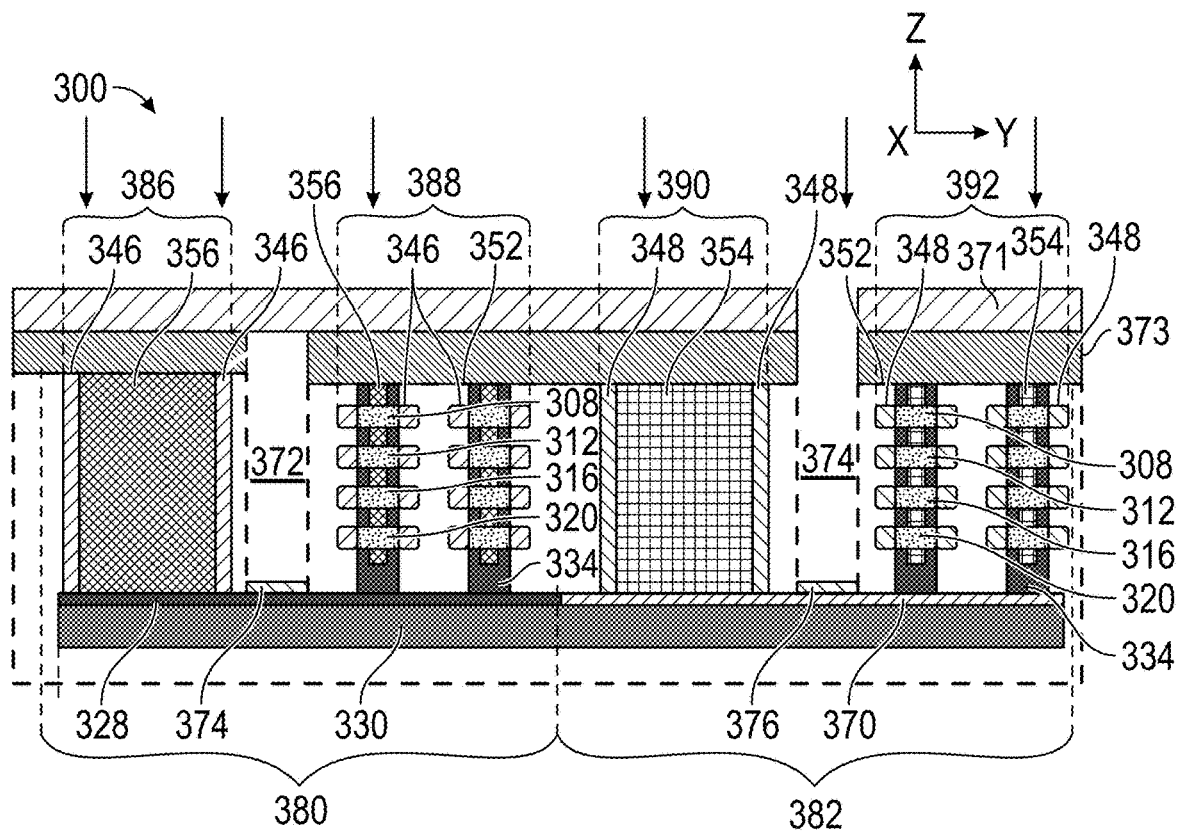
Figure 37:
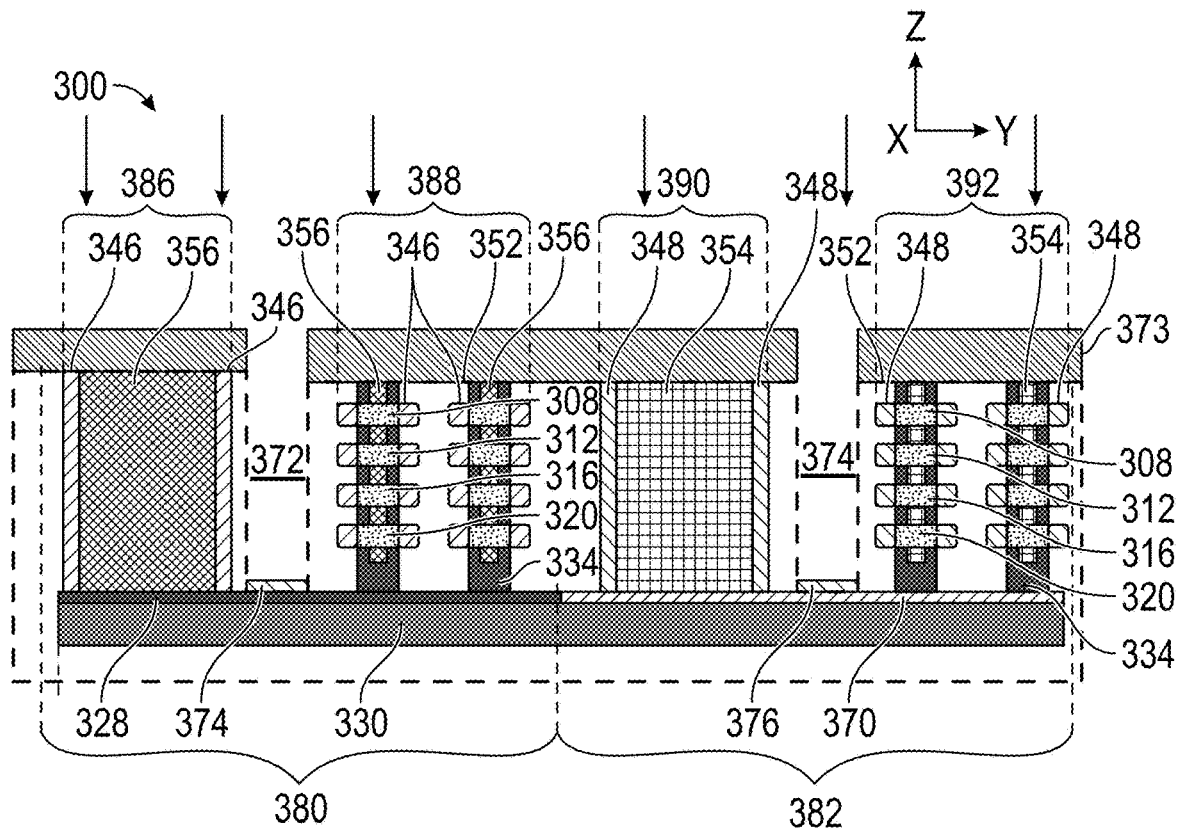

In FIG. 36, photomask is formed for P+ well tie plasma implant 374 with a dose of 5E15 to 5E16 boron a P+ implanted region is shown in 376. The photoresist mask 371 can then be removed in FIG. 37. The process is followed by annealing and silicide N+ and P+ well tie, e.g., contact openings 372 and 374.

Figure 38:
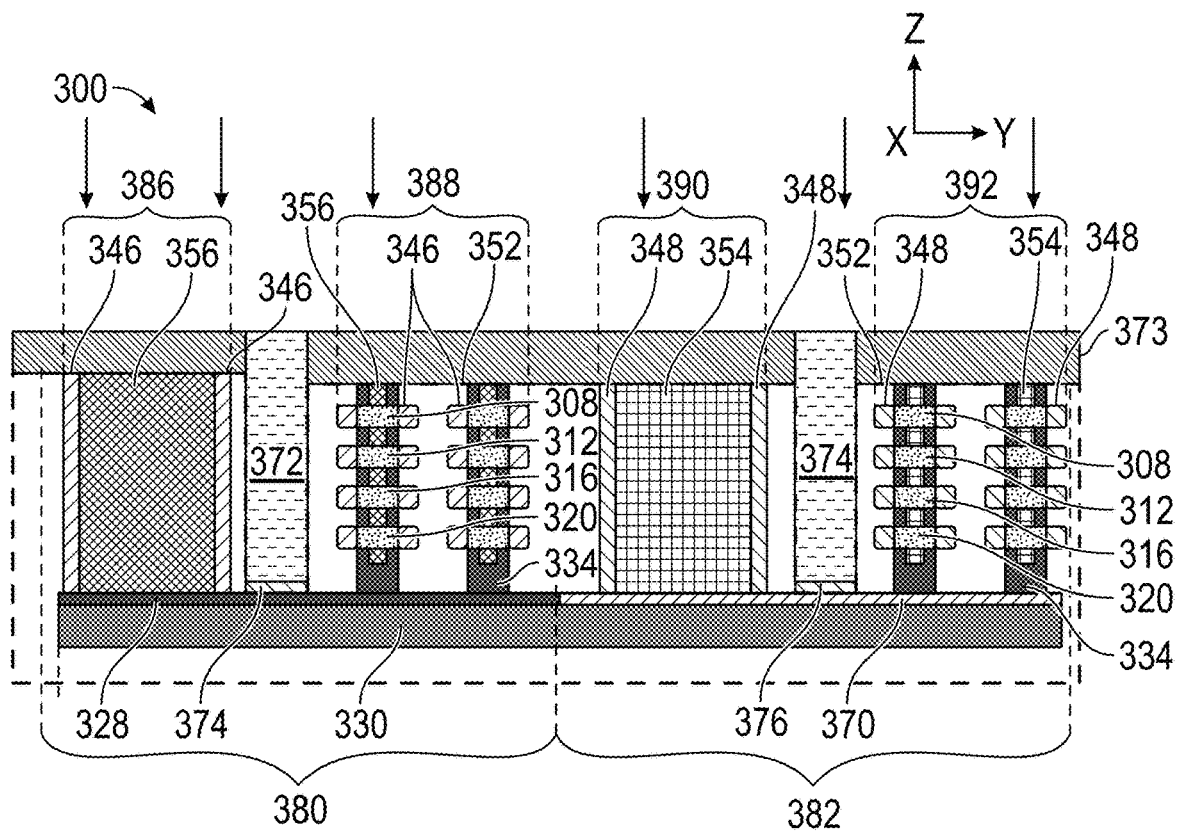

In FIG. 38, TiN liner is deposited into the N+ and P+ well tie, e.g., contact openings 372 and 374, with tungsten fill and CMP removal to complete well tie to the device 300.

In another embodiment, a silicon substrate wafer is used. For the process flow, the block nano sheet and the GAA nano sheet both have the SiGe2 replaced with dielectric material to be isolated from the substrate. The present disclosure allows both block nano sheet transistor and GAA nano sheet transistor to have L and W to be restricted to less than 150 nm and is co-integrated with the block nano sheet. The embodiment is similar to previous embodiments but with a different substrate of only silicon.

Figure 39:
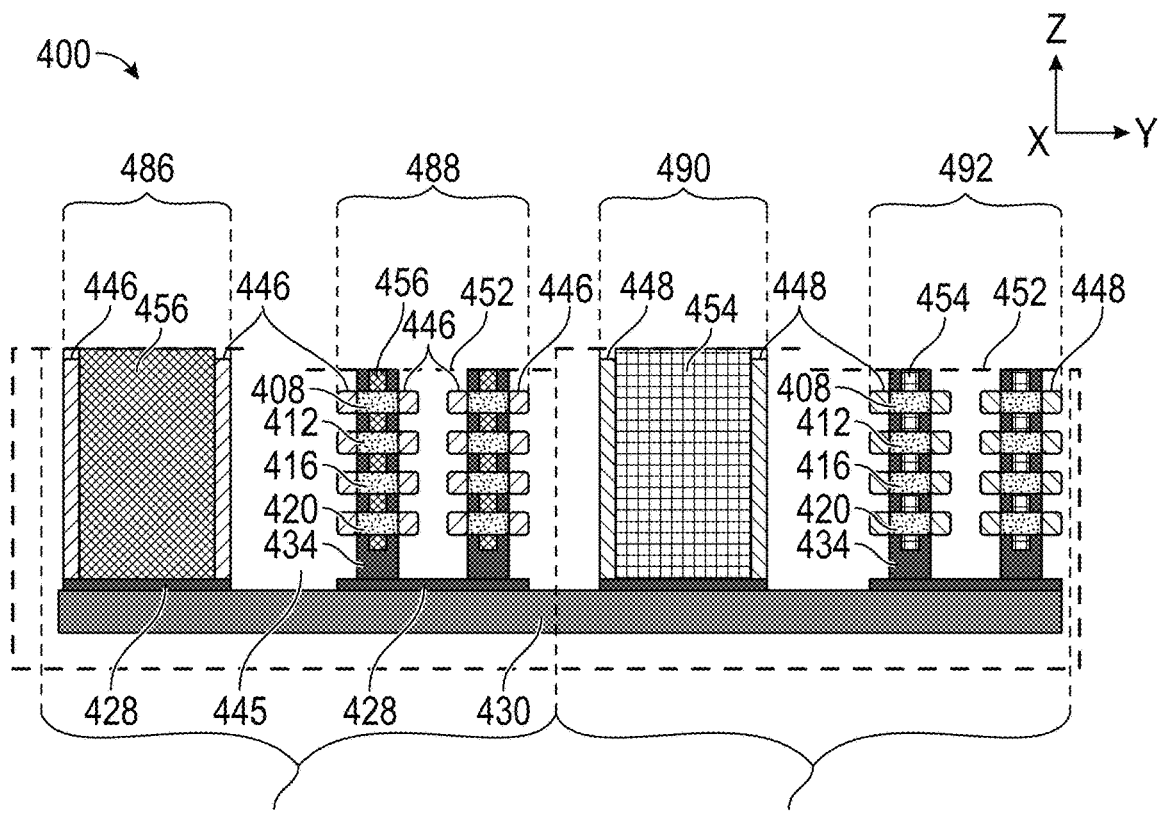
FIG. 39 is a cross-sectional view of a semiconductor device of a third manufacturing process, in accordance with exemplary embodiments of the disclosure.

FIG. 39 shows a device 400 after dual work function configuration is completed. Accordingly, techniques herein provide several options to enable block and GAA nano sheet stacks on a same substrate 430.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
a first field effect transistor disposed adjacent to a stack of field effect transistors on a working surface of a substrate, wherein:
the first field effect transistor having a channel structure formed from a first vertical stack of nano sheets comprising a plurality of first nano sheets each extending parallel to the working surface and being arranged one over another in the first vertical stack perpendicular to the working surface of the substrate, the first vertical stack of nano sheets having a common gate metal, and
the stack of field effect transistors including two or more transistors formed from a second vertical stack of nano sheets comprising a plurality of second nano sheets each extending parallel to the working surface and being arranged one over another in the second vertical stack perpendicular to the working surface of the substrate, each of the second nano sheets of the second vertical stack being on a same vertical level as a corresponding one of the first nano sheets of the first vertical stack, each transistor formed from the second vertical stack having a gate-all-around metal and respective source and drain regions, the second vertical stack being adjacent to the first vertical stack.

2. The semiconductor device of claim 1, wherein nano channels in the first field effect transistor and the stack of field effect transistors are formed from a common epitaxial stack.

3. The semiconductor device of claim 2, wherein the common epitaxial stack comprises at least one of Si, SiGe, and SiGe2.

4. The semiconductor device of claim 1, wherein the substrate comprises at least one of silicon/oxide/silicon substrate, and silicon substrate.

5. The semiconductor device of claim 1, wherein the first field effect transistor has a first threshold voltage and each transistor in the stack of field effect transistors has a second threshold voltage, the first threshold voltage being greater than the second threshold voltage.

6. The semiconductor device of claim 1, wherein the first field effect transistor has a source/drain structure connected to one or more individual nano sheets.

7. A semiconductor device, comprising:
a first field effect transistor disposed adjacent to a stack of field effect transistors on a working surface of a substrate, wherein:
the first field effect transistor having a channel structure formed from a first plurality of nano sheets, the first plurality of nano sheets extending parallel to the working surface and arranged one over another in a first vertical stack perpendicular to the working surface of the substrate, the first plurality of nano sheets having a common gate metal,
the stack of field effect transistors including one or more transistors arranged in a second vertical stack, the one or more transistors having a second plurality of nano sheets on the second vertical stack, each of the second plurality of nano sheets on the second vertical stack having a gate-all-around metal, the second vertical stack being adjacent to the first vertical stack, and
the nano sheets in the first field effect transistor have a greater length than nano sheets in the stack of field effect transistors.

8. A method of forming a semiconductor device, the method comprising:
forming a layer stack of alternating epitaxial materials including two or more layers;
dividing the layer stack of alternating epitaxial materials into a first region of nano sheets and a second region of nano sheets, the first region of nano sheets having a common gate metal and the second region of nano sheets having a gate-all-around metal;
forming a first field effect transistor on a working surface of a substrate using the nano sheets in the first region of nano sheets; and
forming a stack of field effect transistors on the working surface of the substrate using the nano sheets in the second region of nano sheets, each of the stack of field effect transistors having respective source and drain regions.

9. The method of claim 8, wherein the epitaxial materials comprise at least one of Si, SiGe, and SiGe2.

10. The method of claim 8, wherein the substrate comprises at least one of silicon/oxide/silicon substrate, and silicon substrate.

11. The method of claim 8, wherein the two or more layer are for channels of field effect transistors.

12. The method of claim 8, wherein the first region of nano sheets is for transistor with a first threshold voltage and the second region of nano sheets is for transistors with a second threshold voltage, the first threshold voltage being greater than the second threshold voltage.

13. The method of claim 12, wherein the transistors with the second threshold voltage are in a vertical stack.

14. The method of claim 13, wherein the first field effect transistor has the first threshold voltage, and each transistor in the vertical stack has the second threshold voltage, the first threshold voltage being greater than the second threshold voltage.

15. The method of claim 8, wherein the first field effect transistor has a channel structure formed from two or more nano sheets in the first region of nano sheets.

16. The method of claim 15, wherein the two or more nano sheets in the first region of nano sheets each extend parallel to the working surface of the substrate and are disposed one over another in a first vertical stack.

17. The method of claim 16, wherein the first vertical stack is perpendicular to the working surface of the substrate.

18. The method of claim 8, wherein the stack of field effect transistors includes two or more transistors arranged in a second vertical stack.

19. The method of claim 18, wherein each transistor in the second vertical stack includes a nano sheet channel having a gate-all-around structure.

20. The method of claim 8, wherein the first field effect transistor has a source/drain structure connected to one or more individual nano sheets.

* * * * *